United States Patent
Eum et al.

(10) Patent No.: US 11,656,557 B2
(45) Date of Patent: May 23, 2023

(54) APPARATUS FOR TREATING SUBSTRATE

(71) Applicant: SEMES CO., LTD., Cheonan-si (KR)

(72) Inventors: Ki Sang Eum, Cheonan-si (KR); Jung Yul Lee, Cheongju-si (KR); Sun Wook Jung, Hwaseong-si (KR); Yang Yeol Ryu, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 17/531,941

(22) Filed: Nov. 22, 2021

(65) Prior Publication Data
US 2022/0163900 A1    May 26, 2022

(30) Foreign Application Priority Data
Nov. 23, 2020    (KR) .................. 10-2020-0157853

(51) Int. Cl.
*G03F 7/20*    (2006.01)
(52) U.S. Cl.
CPC ................... *G03F 7/70916* (2013.01)
(58) Field of Classification Search
CPC .............. G03F 7/70916; G03F 7/162; H01L 21/67017; H01L 21/67178; H01L 21/67051; H01L 21/6719; H01L 21/6715; H01L 21/68792; H01L 21/68764
See application file for complete search history.

(56) References Cited

U.S. PATENT DOCUMENTS 6,527,860 B1 *    3/2003   Yoshihara ........... H01L 21/6715
                                                             118/62

FOREIGN PATENT DOCUMENTS

| JP | 2000-237669 A | 9/2000 |
| KR | 1019990077743 A | 10/1999 |
| KR | 1020010050979 A | 6/2001 |
| KR | 10-2009-0056805 A | 6/2009 |
| KR | 1020090117084 A | 11/2009 |
| KR | 1020180121867 A | 11/2018 |
| KR | 1020200027161 A | 3/2020 |

OTHER PUBLICATIONS

Korean Patent Office, Office action dated Oct. 27, 2022.

* cited by examiner

*Primary Examiner* — Mesfin T Asfaw
(74) *Attorney, Agent, or Firm* — Li & Cai Intellectual Property (USA) Office

(57) ABSTRACT

An apparatus for treating a substrate includes a processing container having an inner space; a support unit having a support plate configured to support and rotate the substrate in the inner space; a liquid supply unit configured to supply treating liquid to the substrate supported by the support unit; and an exhaust unit configured to exhaust an air flow in the inner space, wherein the exhaust unit includes an air flow guide duct guiding a flow direction of an air flow flowing on the substrate to an outer side of the substrate due to a rotation of the substrate supported by the support unit, and the air flow guide duct having an inlet into which an air flow is introduced, the inlet provided at a substantially same level with the substrate supported by the support unit.

18 Claims, 17 Drawing Sheets

APPARATUS FOR TREATING SUBSTRATE

CROSS-REFERENCE TO RELATED APPLICATIONS

A claim for priority under 35 U.S.C. § 119 is made to Korean Patent Application No. 10-2020-0157853 filed on Nov. 23, 2020, in the Korean Intellectual Property Office, the entire contents of which are hereby incorporated by reference.

BACKGROUND

Embodiments of the inventive concept described herein relate to an apparatus for treating a substrate, and more particularly, relate to an apparatus for treating a substrate by supplying a liquid onto a rotating substrate.

Various processes such as a photolithography process, an etching process, an ashing process, a thin film deposition process, and a cleaning process are carried out to manufacture a semiconductor device or a flat plate display panel. Among these processes, the photolithography process includes supplying a photoresist to a semiconductor substrate to form a photoresist film on a surface of the substrate, exposing the photoresist film using a photomask, and then supplying a developing liquid to selectively remove portions of the photoresist film. These processes are performed in process chambers.

FIG. 1 is a schematic view illustrating a substrate treating apparatus 1 for applying photoresist to a substrate. Referring to FIG. 1, the substrate treating apparatus 1 includes a processing container 10 having an inner space, a support unit 20 for supporting the substrate W in the inner space, and a nozzle 30 for supplying a treating liquid 82 onto the substrate W placed on the support unit 20. The processing container 10 has an outer cup 12 and an inner cup 14. Furthermore, a fan filter unit (not shown) for supplying a downward air flow into the inner space is disposed over the processing container 10, and a drain pipe 60 for draining the treating liquid and an exhaust pipe 70 for exhausting an atmosphere in a treating space are connected to a lower region of the inner space.

When the substrate treating apparatus 1 having the structure illustrated in FIG. 1 treats the substrate W while supplying the treating liquid 82 on the rotating substrate W, an air flow 84 on the surface of the substrate W flows from the center of the substrate W toward the edge thereof along the rotating direction of the substrate W by the centrifugal force as illustrated in FIG. 2. Thereafter, as illustrated in FIG. 3, the air flow 84 flows downward after colliding with the outer cup 12 and is exhausted from the inner space to the outside through the exhaust pipe 70. As the direction of the air flow 84 is changed from the horizontal direction to the vertical direction, the air flow 84 collides with the outer cup 12, and a vortex is generated at the point where the air flow 84 collides with the outer cup 12. The air flow 84 is stagnant at the point where the vortex is generated, and the inner space is not smoothly evacuated accordingly. The problem is further intensified as the rotating speed of the substrate W is increased.

The vortex and the stagnant air flow at the collision point hamper the air flow over the edge region of the substrate W when a film of the treating liquid 82 is formed on the substrate W. Due to this, the thickness of the thin film on the edge region of the substrate W is greater than the thickness of the thin film on the central region of the substrate W. Furthermore, due to the vortex at the collision point, contaminants such as fumes flow back to the substrate W to contaminate the substrate W.

SUMMARY

Embodiments of the inventive concept provide a substrate treating apparatus for improving efficiency in treating a substrate.

Embodiments of the inventive concept provide a substrate treating apparatus for smoothly exhausting an air flow in a treating space when treating a substrate by supplying a treating liquid onto the rotating substrate in the treating space.

Embodiments of the inventive concept provide a substrate treating apparatus for forming a liquid film having a uniform thickness on the entire region of a substrate by supplying a treating liquid onto the rotating substrate.

Embodiments of the inventive concept provide a substrate treating apparatus for preventing re-adsorption of contaminants to a substrate when treating the substrate by supplying a treating liquid onto the rotating substrate.

The technical problems to be solved by the inventive concept are not limited to the aforementioned problems, and any other technical problems not mentioned herein will be clearly understood from the following description by those skilled in the art to which the inventive concept pertains.

An embodiment of the inventive concept provides a substrate treating apparatus.

The apparatus comprises: a processing container having an inner space; a support unit having a support plate configured to support and rotate the substrate in the inner space; a liquid supply unit configured to supply treating liquid to the substrate supported by the support unit; and an exhaust unit configured to exhaust an air flow in the inner space, wherein the exhaust unit includes an air flow guide duct guiding a flow direction of an air flow flowing on the substrate to an outer side of the substrate due to a rotation of the substrate supported by the support unit, and the air flow guide duct having an inlet into which an air flow is introduced, the inlet provided at a substantially same level with the substrate supported by the support unit.

In an embodiment, the inlet provided at the air flow guide duct introduces an air flow in a tangential direction to the rotating direction of the substrate supported by the support unit.

In an embodiment, a plurality of air flow guide ducts are provided placed apart in a circumferential direction of the substrate supported by the support unit.

In an embodiment, the plurality of air flow guide ducts are placed apart at regular intervals based on a center of the rotation of the substrate.

In an embodiment, the support unit comprises: a support plate supporting the substrate; a rotary shaft rotating the substrate; an actuator coupled to the rotary shaft and providing rotation power to the rotary shaft, wherein the processing container comprises: an outer cup providing the inner space; an inner cup placed in the inner space apart from the outer cup, and surrounding the rotary shaft and the actuator, wherein the inner cup defines an exhaust space in an area below the support plate, and the exhaust unit further comprises a separate exhaust pipe for exhausting an air flow introduced into the exhaust space to an outside of the inner space.

In an embodiment, the exhaust unit is placed at an outside of the processing container, and further comprises an integrated exhaust pipe with an installed pressure adjustment member, the separate exhaust pipe and the air flow guide duct connecting to the integrated exhaust pipe.

In an embodiment, the air flow guide duct comprises: an air flow introduction part including an inlet for introducing an air flow in the inner space; an air flow discharge part connecting to the integrated exhaust pipe; and a connecting part connecting the air flow introduction part and the air flow discharge part.

In an embodiment, a length of the air flow introduction part is provided parallel to a tangential direction of the substrate.

In an embodiment, a length of the connecting part is provided in a different direction to a direction of the length of the air flow introduction part.

In an embodiment, the air flow discharge part is placed below and in parallel with the air flow introduction part.

In an embodiment, the air flow guide duct is placed at an outer side of the processing container, the air flow guide duct is formed extending from the inner space to an outside of the processing container, the air flow discharge part includes an exit connecting to the integrated exhaust unit, the inlet of the air flow introduction part is provided in the inner space, and the exit of the air flow discharge part is provided at an outer side of the processing container.

In an embodiment, the substrate treating apparatus further comprises a liquid supply nozzle supplying photoresist to the substrate supported by the support unit.

An embodiment of the inventive concept provides a substrate treating apparatus.

The apparatus comprises: a processing container having an inner space; a support unit having a support plate configured to support and rotate the substrate in the inner space; and an exhaust unit configured to exhaust an air flow in the inner space, wherein the exhaust unit comprises: an exhaust pipe exhausting an air flow through a first path to the outside of the processing container, the first path defined by a space between the inner wall of the processing container and the substrate supported by the supporting plate; and an exhaust space of the inner space below the support plate and in communicate with the space; and an air flow guide duct guiding the air flow to a second path different from the first path.

In an embodiment, the second path is defined by a tangential direction to the rotation direction of the substrate supported by the support unit.

In an embodiment, the air flow guide duct is placed at an outer side of the processing container.

In an embodiment, the processing container comprises: an outer cup providing an inner space; and an inner cup placed in the inner space apart from the outer cup and surrounding the support unit, wherein the inner cup defines an exhaust space below the support plate, and the exhaust unit further comprises a separate exhaust unit configured to exhaust an air flow introduced into the exhaust unit to the outside of the inner space, the exhaust unit further comprises an integrated exhaust pipe located at an outside of the processing container and provided with an installed pressure adjustment member, the inner cup defines the exhaust space in a space under the support plate, and the exhaust unit further comprises a separate exhaust pipe exhausting an air flow introduced into the exhaust unit to the outside of the inner space.

In an embodiment, the air flow guide duct comprises: an air flow introduction part including the inlet introducing an air flow into the inner space; an air flow discharge part connecting to the integrated exhaust pipe, and a connecting unit connecting the air flow introduction part and the air flow discharge part, wherein a length of the air flow introduction part is provided parallel to a tangential direction of the substrate.

An embodiment of the inventive concept provides a substrate treating apparatus.

The apparatus comprises: a processing container having an inner space; a support unit with a support plate configured to support and rotate the substrate in the inner space; and an exhaust unit configured to exhaust an air flow in the inner space, wherein the exhaust unit includes an air flow guide duct guiding an air flow direction flowing to the outer side of the substrate due to the rotation of the substrate supported by the support unit, and the air flow guide duct having an inlet provided at a substantially same level with the substrate supported by the support unit, the inlet of the air flow guide unit is provided to introduce an air flow in a tangential direction to the substrate supported by the support plate, the exhaust unit further comprises an integrated exhaust unit located at an outside of the processing container and provided with a pressure adjustment member, the air flow guide duct comprising: an air flow introduction part with the inlet introducing an air flow into the inner space; an air flow discharge part connecting to the integrated exhaust pipe; and a connecting unit connecting the air flow introduction part and the air flow discharge part, wherein the air flow introduction part is provided with its length parallel to a tangential direction of the substrate.

In an embodiment, a plurality of the air flow guide ducts are placed apart in regular intervals.

In an embodiment, the air flow guide ducts are formed extending to the outside of the processing container from the inner space.

According to the inventive concept, a treating liquid is supplied to a substrate rotating in an inner space of a processing container to smoothly exhaust an air flow in the inner space when the substrate is treated.

According to another embodiment of the inventive concept, when a treating liquid is supplied to a rotating substrate to form a liquid film on the substrate, the thickness of the liquid film may be uniformly formed in the entire region of the substrate.

According to the inventive concept, it is possible to prevent contaminants from being reattached to the substrate when treating the substrate by supplying a treating liquid to the rotating substrate.

The effects of the inventive concept are not limited to the above-described effects, and effects not mentioned will be clearly understood by those skilled in the art from the present specification and the accompanying drawings.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
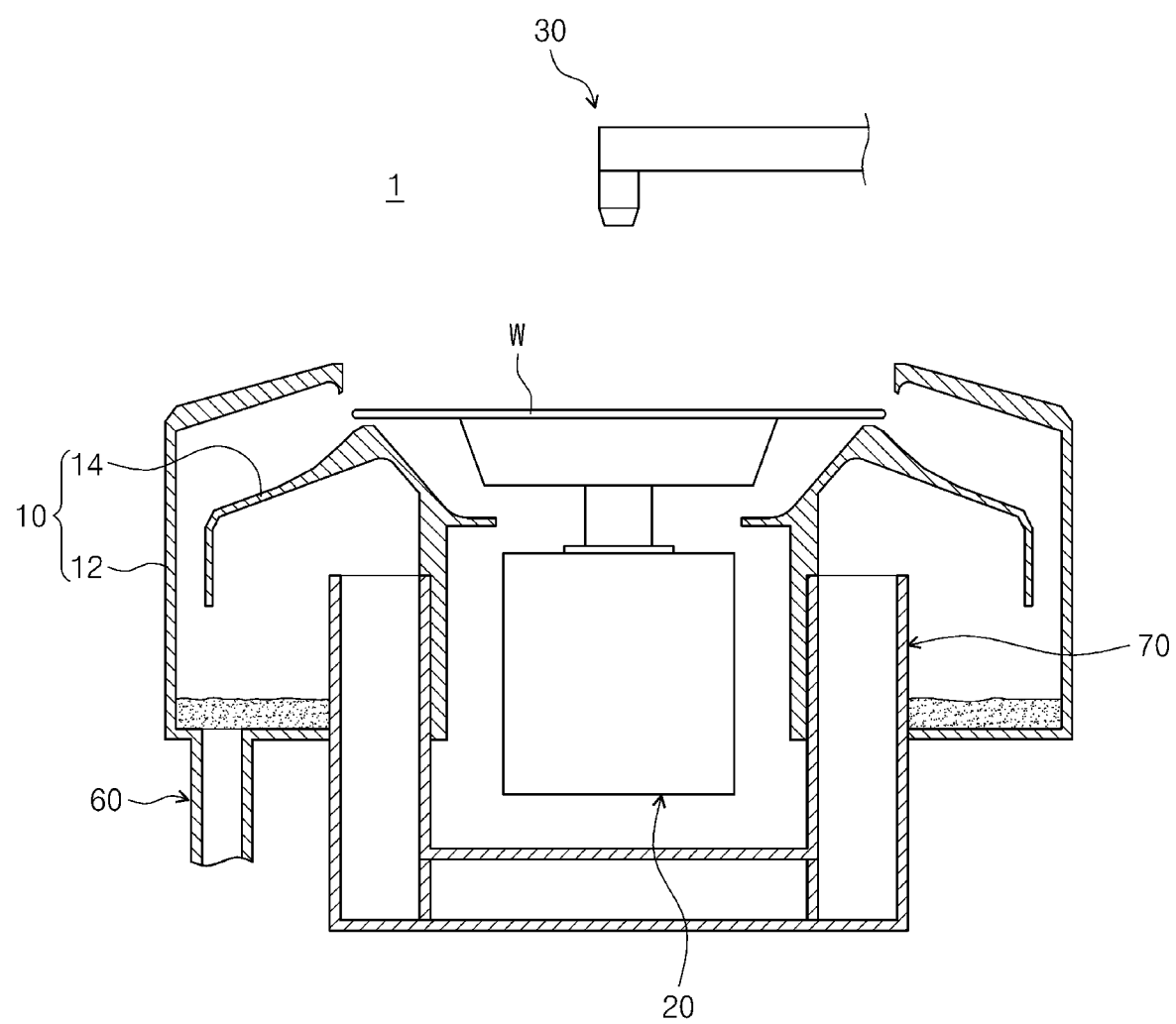
FIG. 1 is a sectional view illustrating a substrate treating apparatus having a general structure for performing liquid treatment on a substrate while rotating the substrate.
Figure 2:
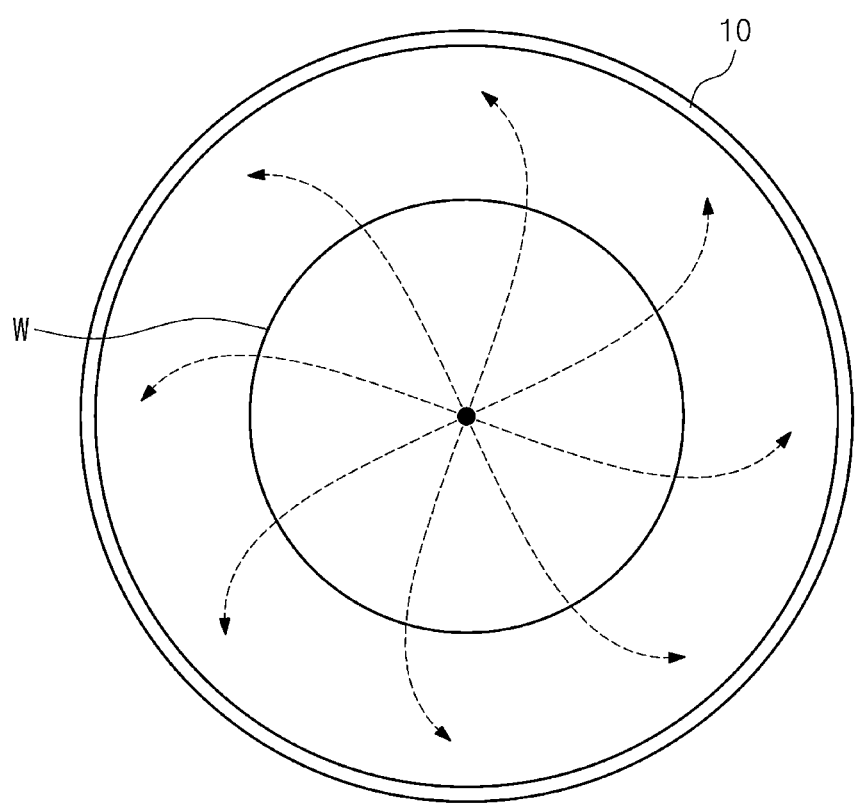
FIG. 2 is a plan view illustrating a direction of an air flow on a surface of the substrate in the substrate treating apparatus of FIG. 1.
Figure 3:
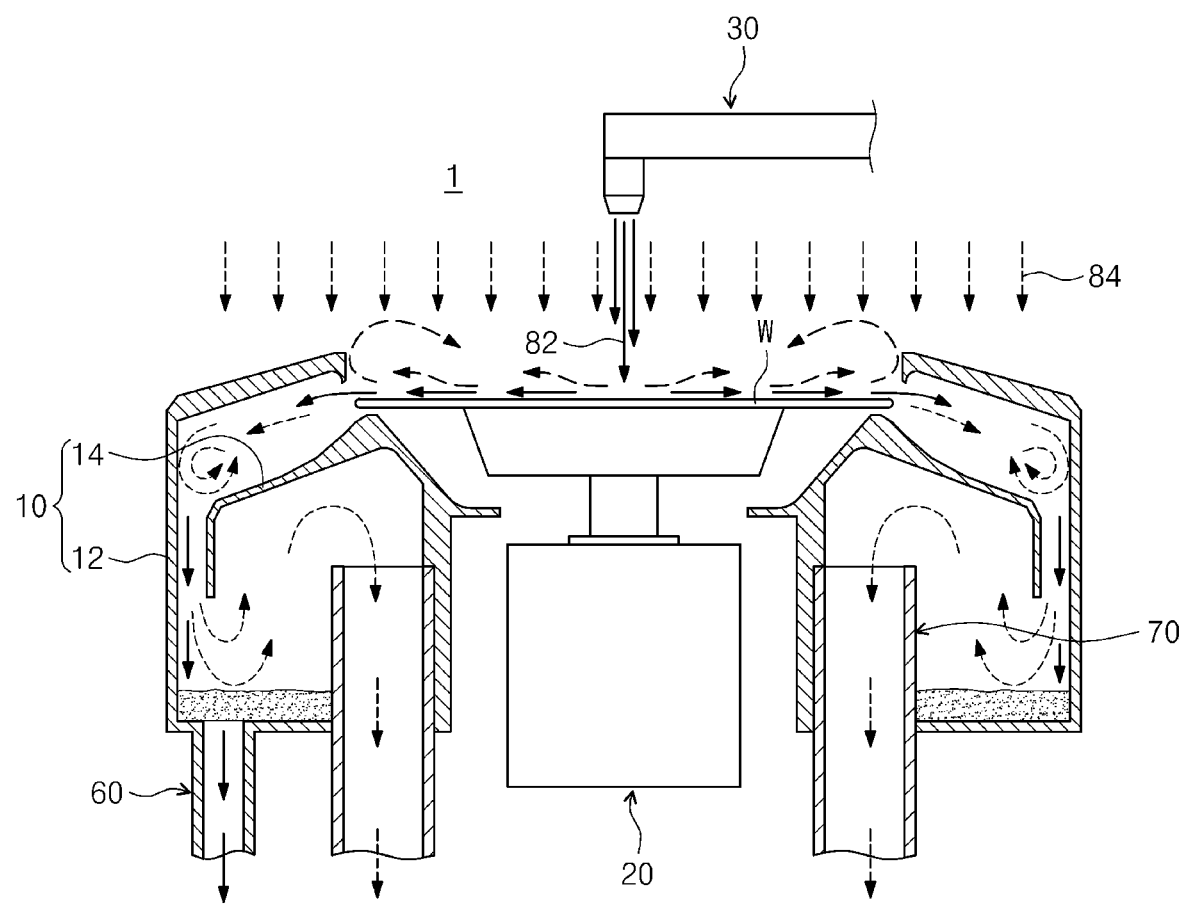
FIG. 3 is a sectional view illustrating the air flow in the substrate treating apparatus of FIG. 1.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be exaggerated or omitted when it may make the essence of the inventive concept unclear.

An apparatus of this embodiment may be used to perform a photolithography process on a circular substrate. In particular, the apparatus of this embodiment may be connected to an exposure apparatus and may be used to perform a coating process and a developing process on a substrate. However, the spirit and scope of the inventive concept is not limited thereto, and the apparatus may be used to perform various types of processes of supplying a treating liquid onto a substrate while rotating the substrate. In the following description, it will be exemplified that a wafer is used as a substrate.

Hereinafter, embodiments of the inventive concept will be described with reference to FIG. 4 to FIG. 14.

Figure 4:
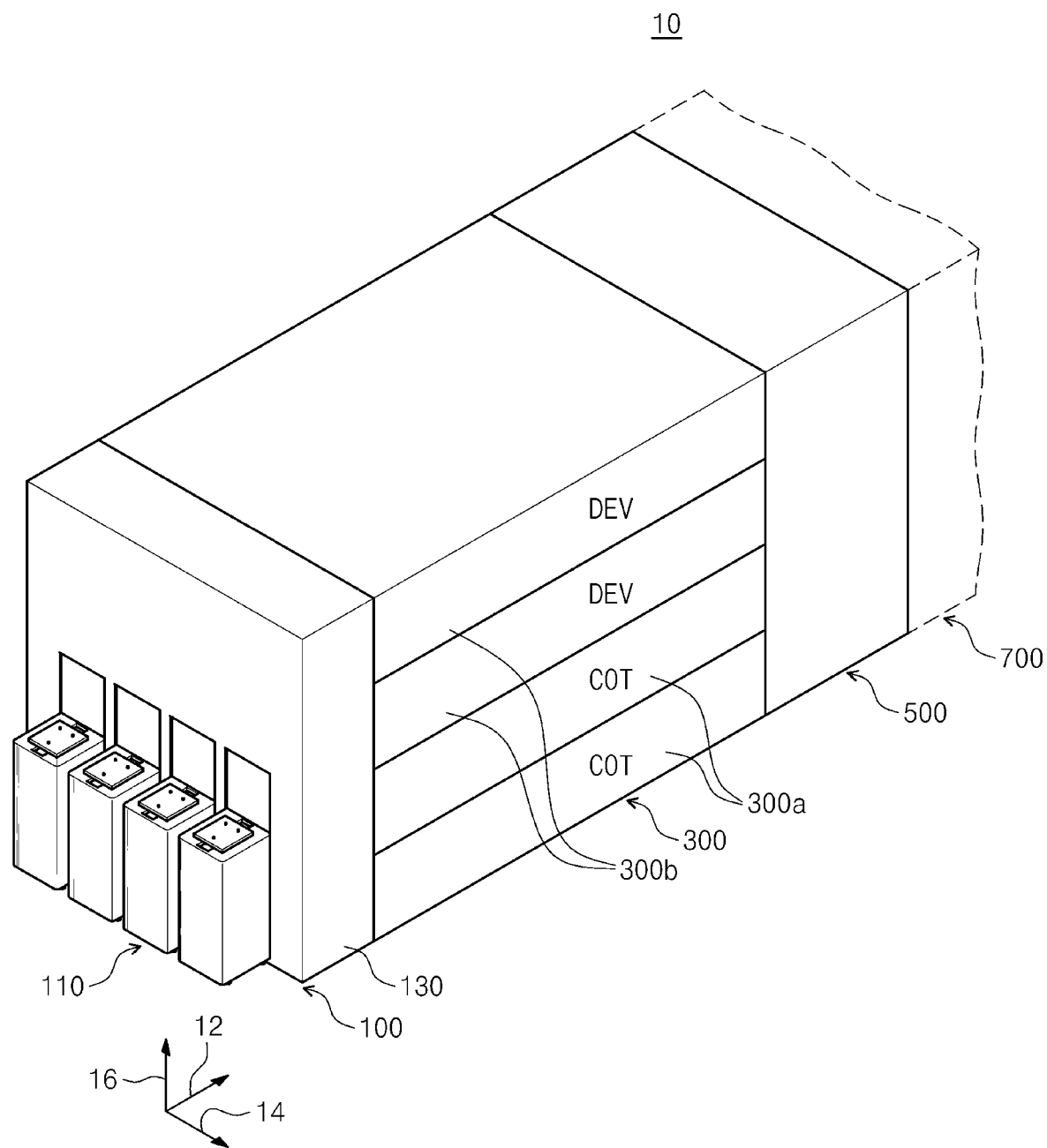
FIG. 4 is a schematic perspective view illustrating a substrate treating apparatus according to an embodiment of the inventive concept.
Figure 5:
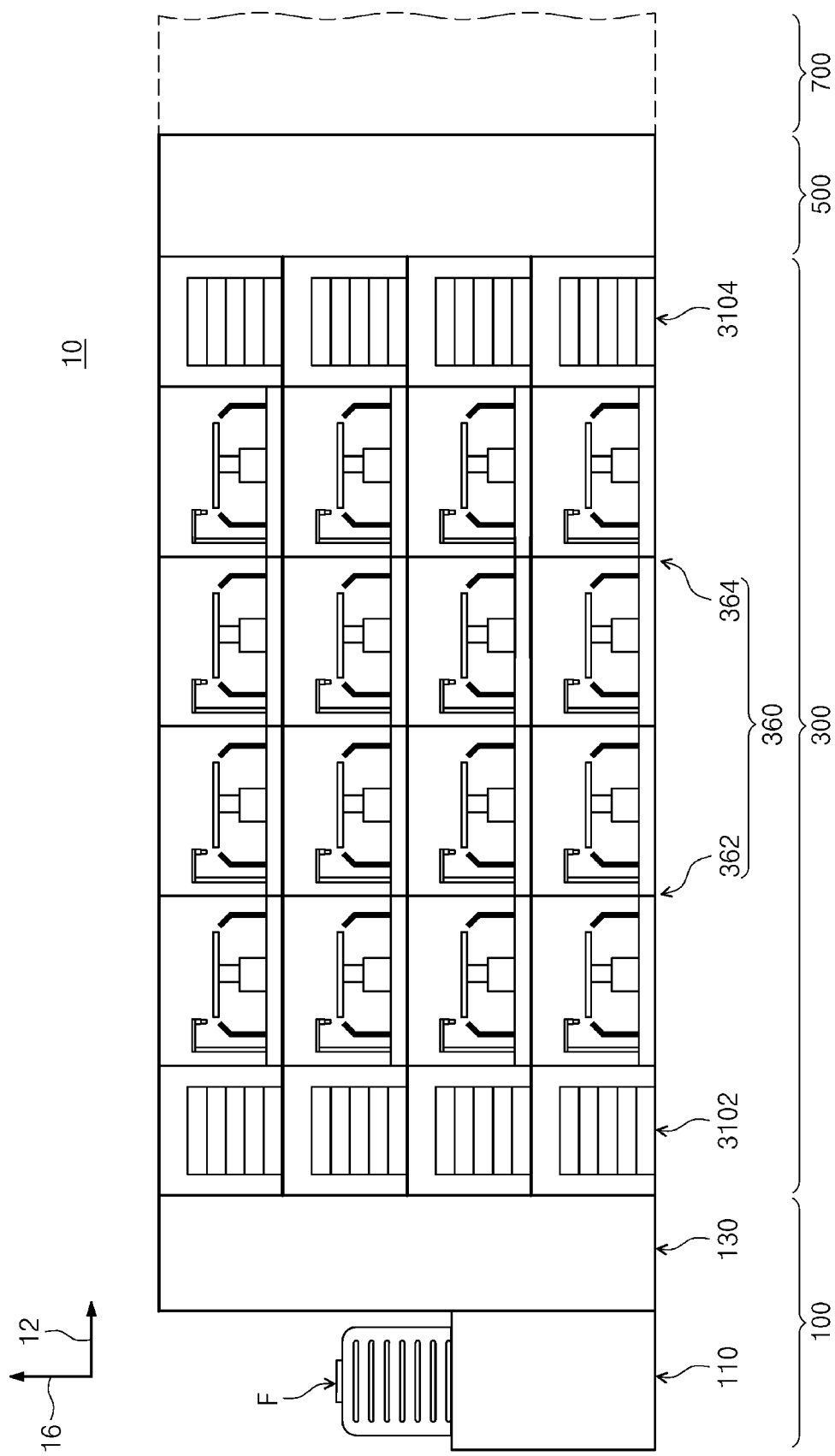
FIG. 5 is a sectional view of the substrate treating apparatus illustrating coating blocks and developing blocks of FIG. 4.
Figure 6:
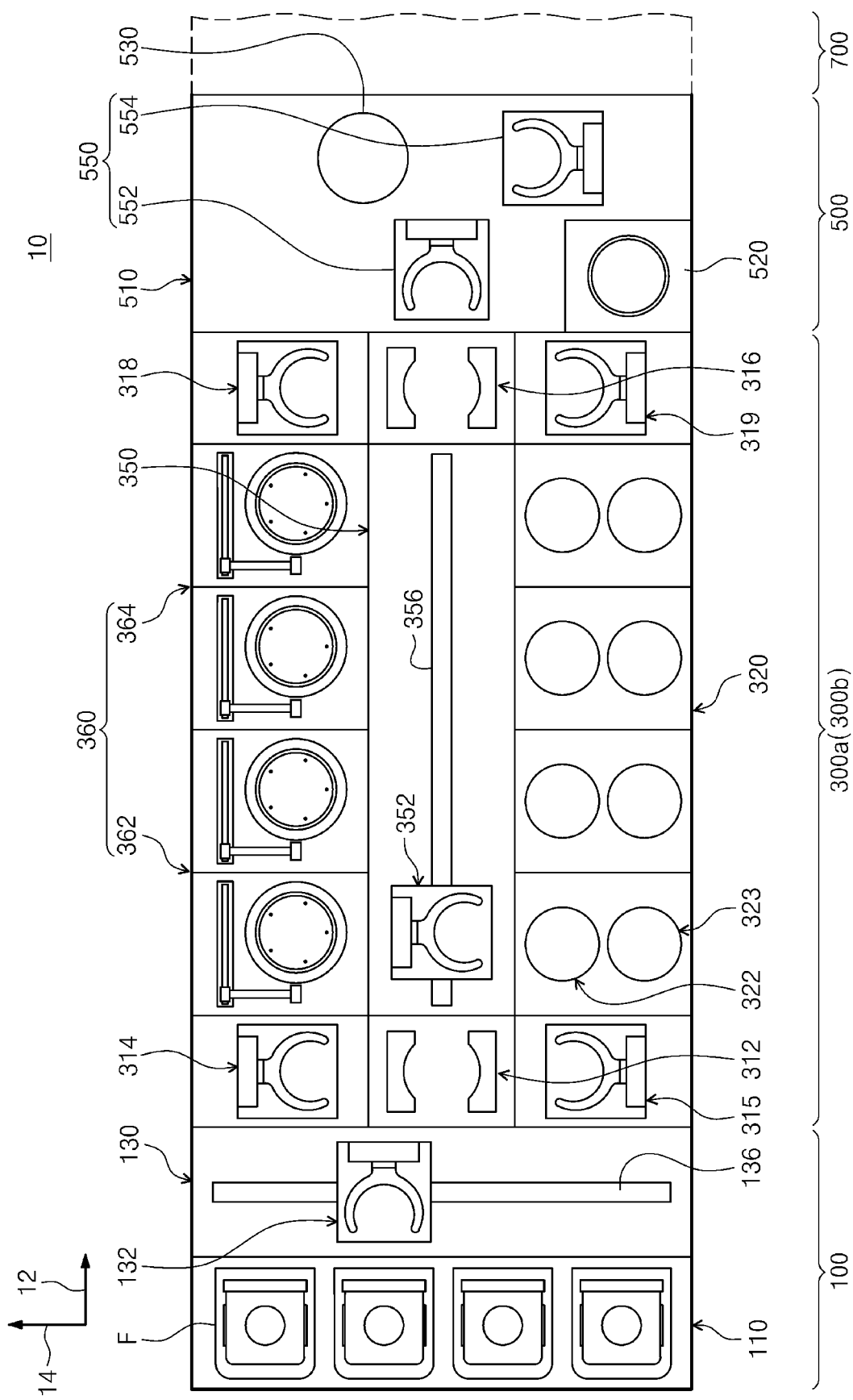
FIG. 6 is a plan view of the substrate treating apparatus of FIG. 4.

FIG. 4 is a schematic perspective view illustrating a substrate treating apparatus according to an embodiment of the inventive concept. FIG. 5 is a sectional view of the substrate treating apparatus illustrating coating blocks and developing blocks of FIG. 4. FIG. 6 is a plan view of the substrate treating apparatus of FIG. 4.

Referring to FIG. 4 to FIG. 6, the substrate treating apparatus 10 according to the embodiment of the inventive concept includes an index module 100, a processing module 300, and an interface module 500. According to an embodiment, the index module 100, the processing module 300, and the interface module 500 are sequentially arranged in a row. Hereinafter, a direction in which the index module 100, the processing module 300, and the interface module 500 are arranged will be referred to as a first direction 12, a direction that is perpendicular to the first direction 12 when viewed from above is referred to as a second direction 14, and a direction that is perpendicular to both the first direction 12 and the second direction 14 will be referred to as a third direction 16.

The index module 100 transfers substrates W from a container F in which the substrate W is stored to the processing module 300, and gets the processed substrate W from the processing module 300 to be stored in the container F. The index module 100 is provided with its length extending along the second direction 14. The index module 100 has a load port 110 and an index frame 130. The index frame 130 is placed between the load port 110 and the processing module 300. The container F in which the substrates are stored is placed at the load port 110. A plurality of load ports 110 may be provided, and the plurality of load ports 110 may be placed along the second direction 14.

For the container F, a closing-type container such as a front open unified pod (FOUP) may be used. The container F can be placed on the load port 110 by a transfer means (not shown), such as an overhead transfer, an overhead conveyor, or an automatic guided vehicle, or the container F may be placed on the load port 110 by an operator.

An index robot 132 is provided inside the index frame 130. In the index frame 130, a guide rail 136 is provided with its length extending along the second direction 14, and the index robot 132 may be provided movable on the guide rail 136. The index robot 132 includes a hand on which a substrate W is placed, and the hand may be provided to be forwardly and backwardly movable, rotatable with the third direction as an axis, and movable along the third direction 16.

The processing module 300 may perform a coating process and a developing process on the substrate W. The processing module 300 may receive the substrate W accommodated in the container F and may perform a substrate treating process. The processing module 300 has a coating block 300a and a developing block 300b. The coating block 300a perform a coating process on the substrate W, and the developing block 300b performs a developing process on the substrate W. A plurality of the coating blocks 300a are stacked one above another. A plurality of the developing blocks 300b are provided, and the plurality of developing blocks 300b are provided to be stacked one above another. According to the embodiment of FIG. 4, two coating blocks 300a and two developing blocks 300b are provided. The coating blocks 300a may be disposed under the developing blocks 300b. In an embodiment, the two coating blocks 300a may perform the same process and may be provided in the same structure. In addition, the two developing blocks 300b may perform the same process and may have the same structure.

Referring to FIG. 6, each of the coating blocks 300a include a heat treatment chamber 320, a transfer chamber 350, a liquid treatment chamber 360, and buffer chambers 312 and 316. The heat treatment chamber 320 may be chambers for performing a heat treatment process on the substrate W. The heat treatment process may include a cooling process and a heating process. The liquid treatment chamber 360 supplies liquid onto the substrates W to form a liquid layer. The liquid layer may be a photoresist film or an anti-reflection film. The transfer chamber 350 transfers the substrates W between the heat treatment chamber 320 and the liquid treatment chamber 360 in the coating block 300a.

The transfer chamber 350 is provided with its length parallel to the first direction 12. A transfer robot 352 is provided in the transfer chamber 350. The transfer robot 352 transfers the substrate among the heat treatment chamber 320, the liquid treatment chamber 360, and the buffer chambers 312 and 316. In an embodiment, the transfer robot 352 has a hand on which the substrate W is placed, and the hand may be provided to be forwardly and backwardly movable, rotatable with the third direction 16 as an axis, and movable along the third direction 16. A guide rail 356 is provided in the transfer chamber 350 with its length parallel to the first direction 12, and the transfer robot 352 may be provided to be movable on the guide rail 356.

Figure 7:
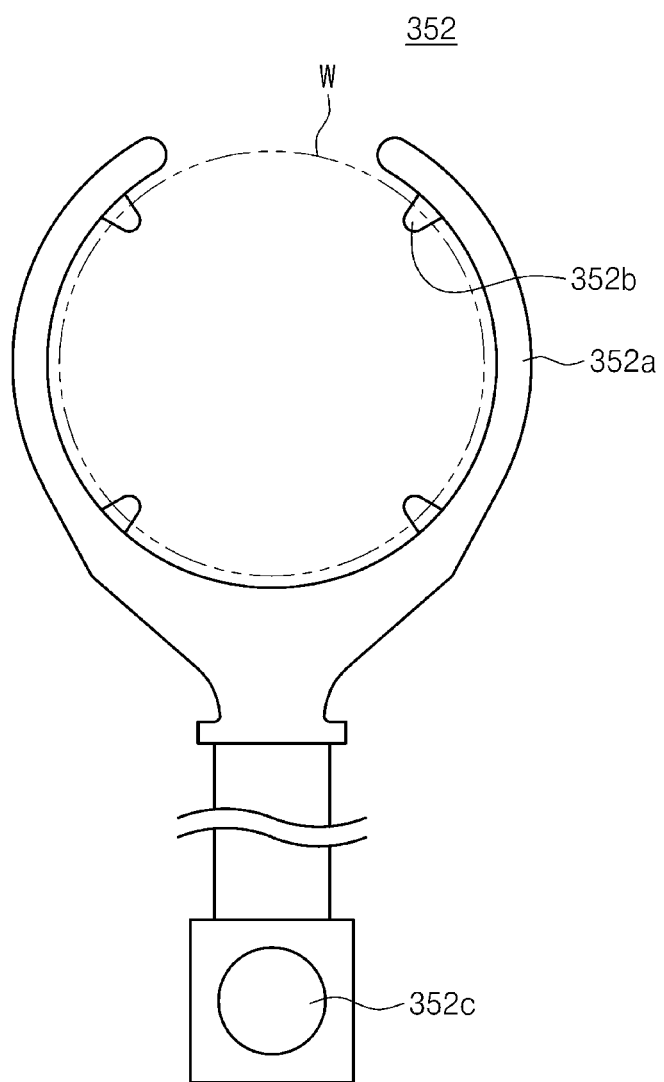
FIG. 7 is a schematic plan view illustrating a transfer robot of FIG. 6.

FIG. 7 is a view illustrating one example of the hand of the transfer robot. Referring to FIG. 7, the hand 352 has a base 352a and protrusions 352b. The base 352a may have an annular ring shape with the circumference of which being partly cut out. The base 352a has an inner diameter larger than the diameter of a substrate W. The protrusions 352b extend inward from the base 352a. The protrusions 352 support an edge region of the substrate W. According to an embodiment, four protrusions 352 may be provided with being spaced apart at equal intervals.

A plurality of heat treatment chambers 320 are provided. The heat treatment chambers 320 are arranged along the first direction 12. The heat treatment chambers 320 are placed on one side of the transfer chamber 350.

Figure 8:
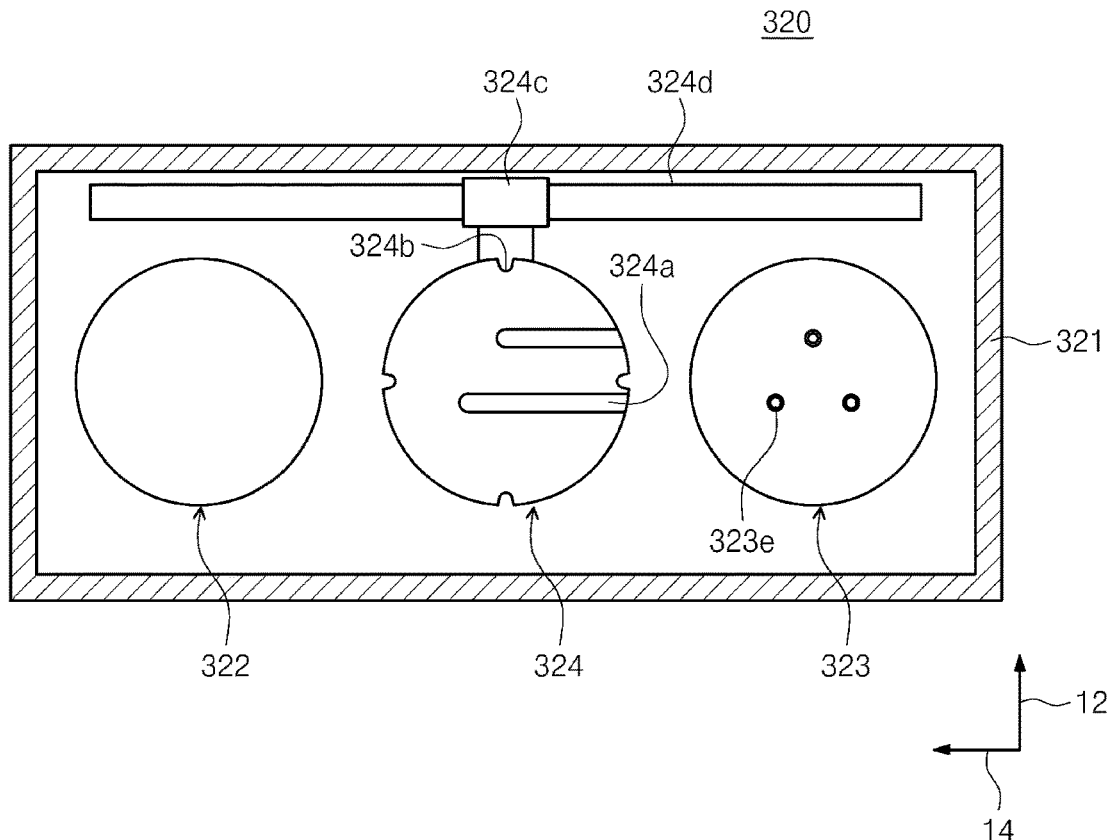
FIG. 8 is a schematic plan view illustrating one example of heat treatment chambers of FIG. 6.
Figure 9:
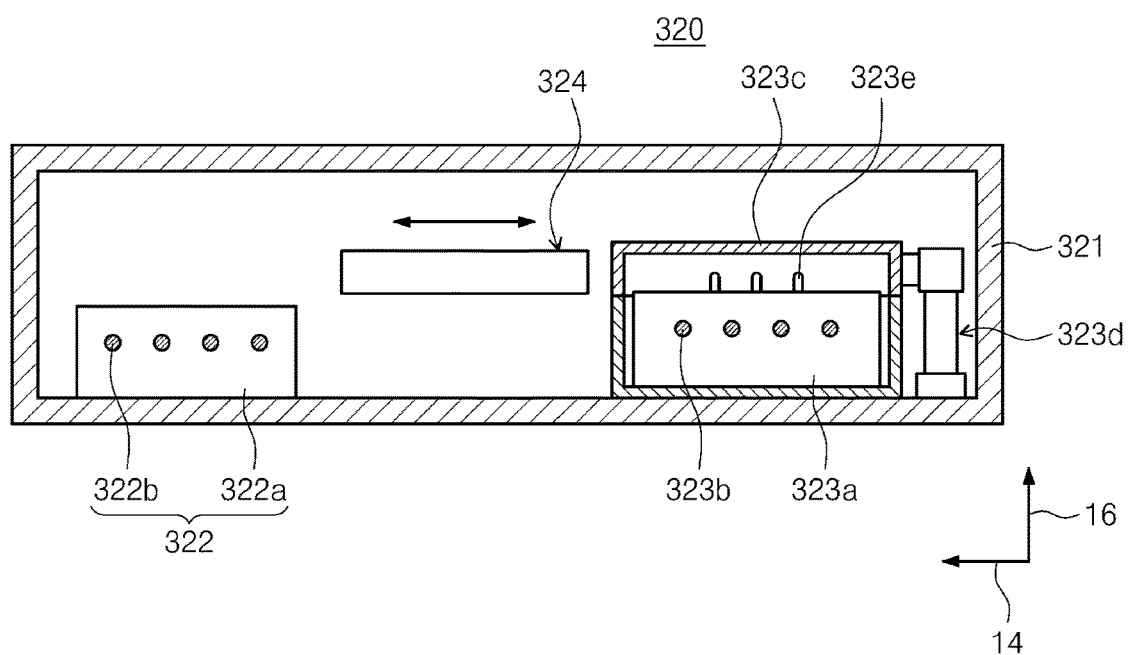
FIG. 9 is a front view of the heat treatment chamber of FIG. 8.

FIG. 8 is a schematic plan view illustrating one example of the heat treatment chambers of FIG. 6, and FIG. 9 is a front view of the heat treatment chamber of FIG. 8.

Referring to FIG. 8 and FIG. 9, the heat treatment chamber 320 has a housing 321, a cooling unit 322, a heating unit 323, and a transfer plate 324.

The housing 321 is provided in a substantially rectangular parallelepiped shape. An inlet (not shown) through which the substrate W enters and exits is provided on the sidewall of the housing 321. The inlet may remain open. Alternatively, a door (not shown) may be provided to open and close the inlet. The cooling unit 322, the heating unit 323, and the transfer plate 324 are provided in the housing 321. The cooling unit 322 and the heating unit 323 are provided side by side along the second direction 14. In an embodiment, the cooling unit 322 may be placed closer to the transfer chamber 350 than to the heating unit 323.

The cooling unit 322 has a cooling plate 322a. The cooling plate 322a may have a substantially circular shape when viewed from above. A cooling member 322b is provided inside the cooling plate 322a. In an embodiment, the cooling member 322b is formed inside the cooling plate 322a and may be provided as a path through which the cooling fluid flows.

The heating unit 323 has a heating plate 323a, a cover 323c, and a heater 323b. The heating plate 323a has a generally circular shape when viewed from above. The heating plate 323a has a larger diameter than the substrate W. The heater 323b is installed inside the heating plate 323a. The heater 323b may be implemented with a resistance heating element to which an electric current is applied. The heating plate 323a is provided with lift pins 323e that may be vertically movable along the third direction 16. The lift pins 323e receive the substrate W from the transfer means outside the heating unit 323 and place the substrate W down on the heating plate 323a, or raise the substrate W off the heating plate 323a and transfer the substrate W to the transfer unit outside the heating unit 323. According to an embodiment, three lift pins 323e may be provided. The cover 323c has a space therein, which is open at the bottom. The cover 323c is located over the heating plate 323a and is vertically moved by the actuator 323d. A space formed together with the heating plate 323a by moving the cover 323c serves as a heating space in which the substrate W is heated.

The transfer plate 324 has a substantially circular plate shape and has a diameter corresponding to that of the substrate W. A notch 324b is formed at an edge of the transfer plate 324. The notch 324 may have a shape corresponding to the protrusion 352b formed on the hand of the transfer robot 352. In addition, as many notches 324b as the protrusions 352b formed on the hand are formed in a position corresponding to the protrusions 352b. When the vertical positions of the hand and the transfer plate 324 aligned with each other in the up/down direction are changed, the substrate W is transferred between the hand and the transfer plate 324. The transfer plate 324 is mounted on a guide rail 324d and is moved along the guide rail 324d by an actuator 324c. A plurality of guide grooves 324a in a slit shape are provided in the transfer plate 324. The guide grooves 324a extend inward from the edge of the transfer plate 324. The guide grooves 324a are provided with their length extending along the second direction 14. The guide grooves 324a prevents the transfer plate 324 and the lift pin 323e from interfering with each other when the substrate W is handed over between the transfer plate 324 and the heating unit 323.

The substrate W is cooled in a state in which the transfer plate 324 having the substrate W placed thereon is brought into contact with the cooling plate 322a. For efficient heat transfer between the cooling plate 322a and the substrate W, the transfer plate 324 is formed of a material having high heat conductivity. In an embodiment, the transfer plate 324 may be formed of a metallic material.

The heating units 323 provided in some of the heat treatment chambers 320 may supply gas while heating the substrate to improve adhesion of photoresist to the substrate W. According to an embodiment, the gas may be a hexamethyldisilane (HMDS) gas.

A plurality of the liquid treatment chambers 360 are provided. Some of the liquid treatment chambers 360 may be stacked on each other. The liquid treatment chambers 360 are located on one side of the transfer chamber 350. The liquid treatment chambers 360 are arranged side by side along the first direction 12. Some of the liquid treatment chambers 360 are located adjacent to the index module 100. Hereinafter, these liquid treatment chambers 360 are referred to as front liquid treatment chambers 362. Some other liquid treatment chambers 360 are located adjacent to the interface module 500. Hereinafter, these liquid treatment chambers 360 are referred to as rear liquid treatment chambers 364.

Each of the front liquid treatment chambers 362 applies a first liquid to the substrate W, and each of the rear liquid treatment chambers 364 applies a second liquid to the substrate W. The first liquid and the second liquid may be different types of liquids. In an embodiment, the first liquid may be a liquid for forming an anti-reflection layer, and the second liquid may be a liquid for forming a photoresist layer. The photoresist may be applied to the substrate W coated with the anti-reflection film. Alternatively, the first liquid may be photoresist liquid, and the second liquid may be a liquid for forming an anti-reflection layer. In this case, the liquid for forming an anti-reflection layer may be applied to the substrate W coated with the photoresist layer. Alternatively, the first liquid and the second liquid may be of the same kind of liquid, and both the first liquid and the second liquid may be liquids for forming the photoresist layer.

The developing block 300b has the same structure as the coating block 300a, and the liquid treatment chamber provided in the developing block 300b supplies a developing solution onto the substrate.

The interface module 500 connects the treating module 300 to the external exposure device 700. The interface module 500 has an interface frame 510, an additional process chamber 520, an interface buffer 530, and an interface robot 550.

A fan filter unit forming a descending airflow may be provided at a top end of the interface frame 510. The additional process chamber 520, the interface buffer 530, and the interface robot 550 are disposed inside the interface frame 510. The additional process chamber 520 may perform a predetermined additional process before the substrate W on which the process is completed is brought into the exposure device 700 in the coating block 300a. Alternatively, the additional process chamber 520 may perform a predetermined additional process before the substrate W on which the process is completed is brought into the developing block 300b from the exposure device 700. According to an embodiment, the additional process may be an edge exposure process of exposing the edge region of the substrate W, a top surface cleaning process of cleaning the top surface of the substrate W, or a bottom surface cleaning process of cleaning the bottom surface of the substrate W. A plurality of additional process chambers 520 may be provided, and they may be provided stacked one above another. All of the additional process chambers 520 may be provided to perform the same process. Alternatively, some of the additional process chambers 520 may be provided to perform different processes.

The interface buffer 530 provides a space in which the substrate W transferred between the coating block 300a, the additional process chamber 520, the exposure device 700, and the developing block 300b temporarily stays during transportation. A plurality of interface buffers 530 may be provided, and a plurality of interface buffers 530 may be provided stacked one above another.

According to an embodiment, an additional process chamber 520 may be disposed on one side and an interface buffer 530 may be disposed on the other side based on a line extending in the direction of the length of the transfer chamber 350.

The interface robot 550 transfers the substrate W between the coating block 300a, the additional process chamber 520, the exposure device 700, and the developing block 300b.

The interface robot 550 may have a transfer hand for transferring the substrate W. The interface robot 550 may be provided as one or a plurality of robots. According to an embodiment, the interface robot 550 has a first robot 552 and a second robot 554. The first robot 552 may be provided to transfer the substrate W between the coating block 300a, the additional process chamber 520, and the interface buffer 530, the second robot 554 may transfer the substrate W between the interface buffer 530 and the exposure device 700.

Each of the first robot 552 and the second robot 554 includes a transfer hand on which the substrate W is placed, and the hand may be provided to move forwardly and backwardly, rotatable with respect to an axis parallel to the third direction 16, and movable along the third direction 16.

Hereinafter, a structure of a substrate treating apparatus for treating a substrate by supplying a treating liquid onto the rotating substrate among substrate treating apparatuses of the inventive concept will be described in detail. It will be exemplified that the substrate treating apparatus is an apparatus for applying photoresist. However, the substrate treating apparatus may be an apparatus for forming a film, such as a protective film or an anti-reflection film, on a rotating substrate W. Selectively, the substrate treating apparatus may be an apparatus for supplying a treating liquid 82, such as a developing solution, onto a substrate W.

Figure 10:
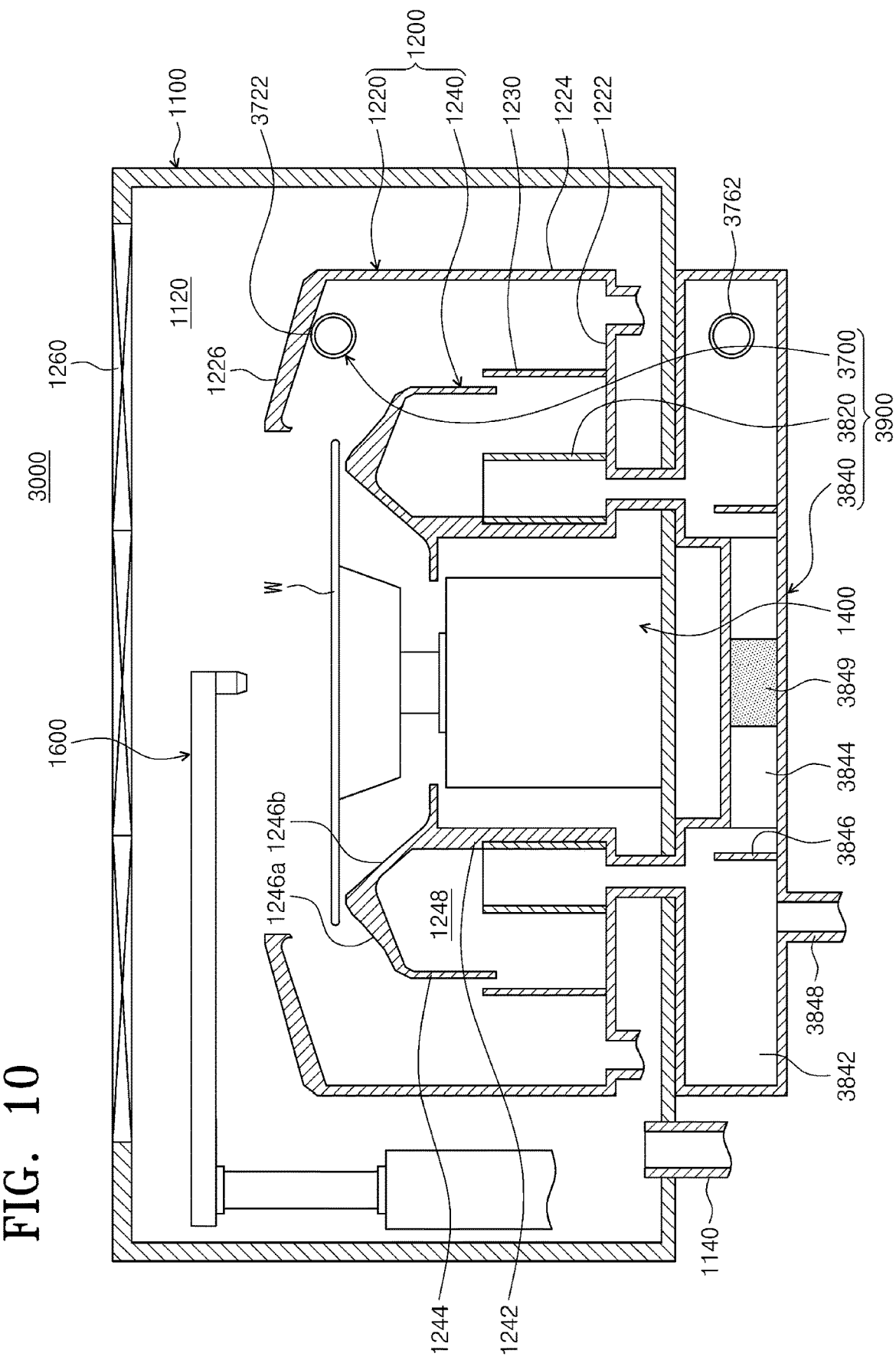
FIG. 10 is a schematic sectional view illustrating a structure of a substrate treating apparatus for treating a substrate by supplying a liquid onto the rotating substrate according to an embodiment of the inventive concept.
Figure 11:
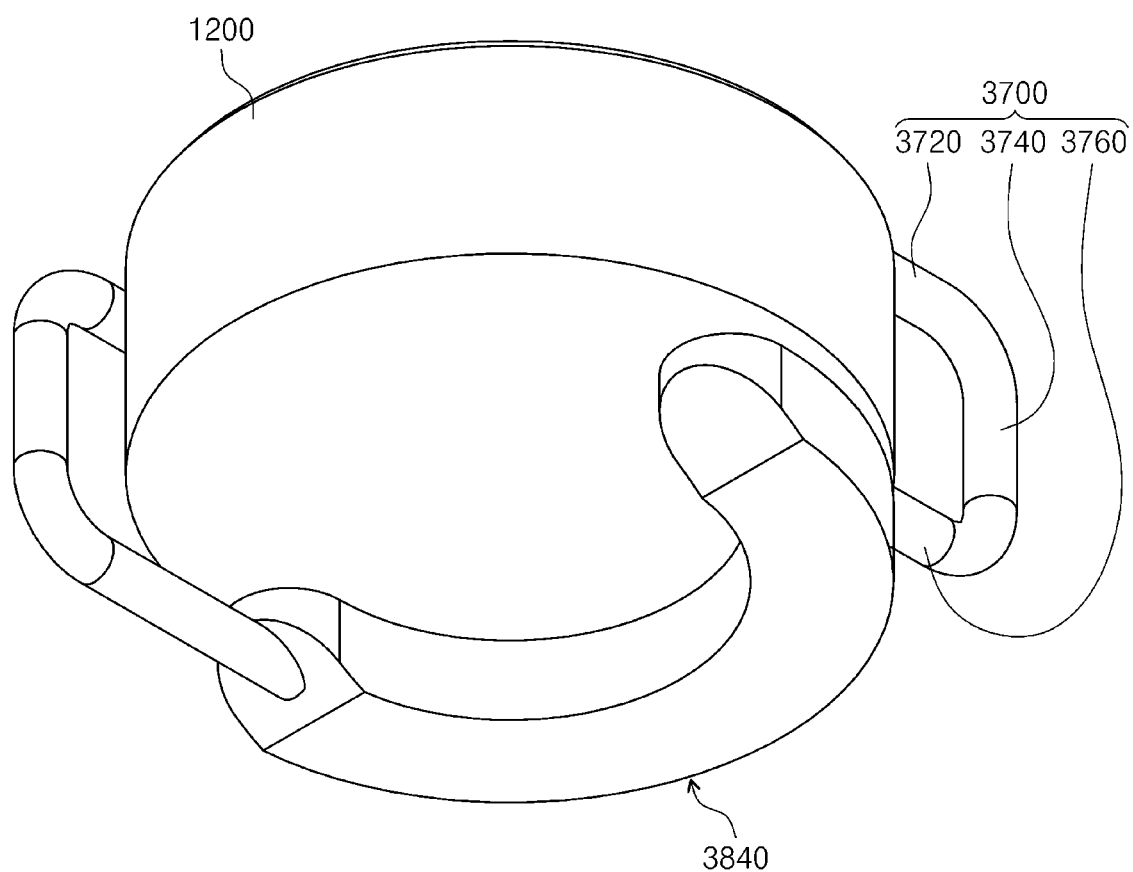
FIG. 11 is a perspective view of an exterior of the substrate treating apparatus of FIG. 10.
Figure 12:
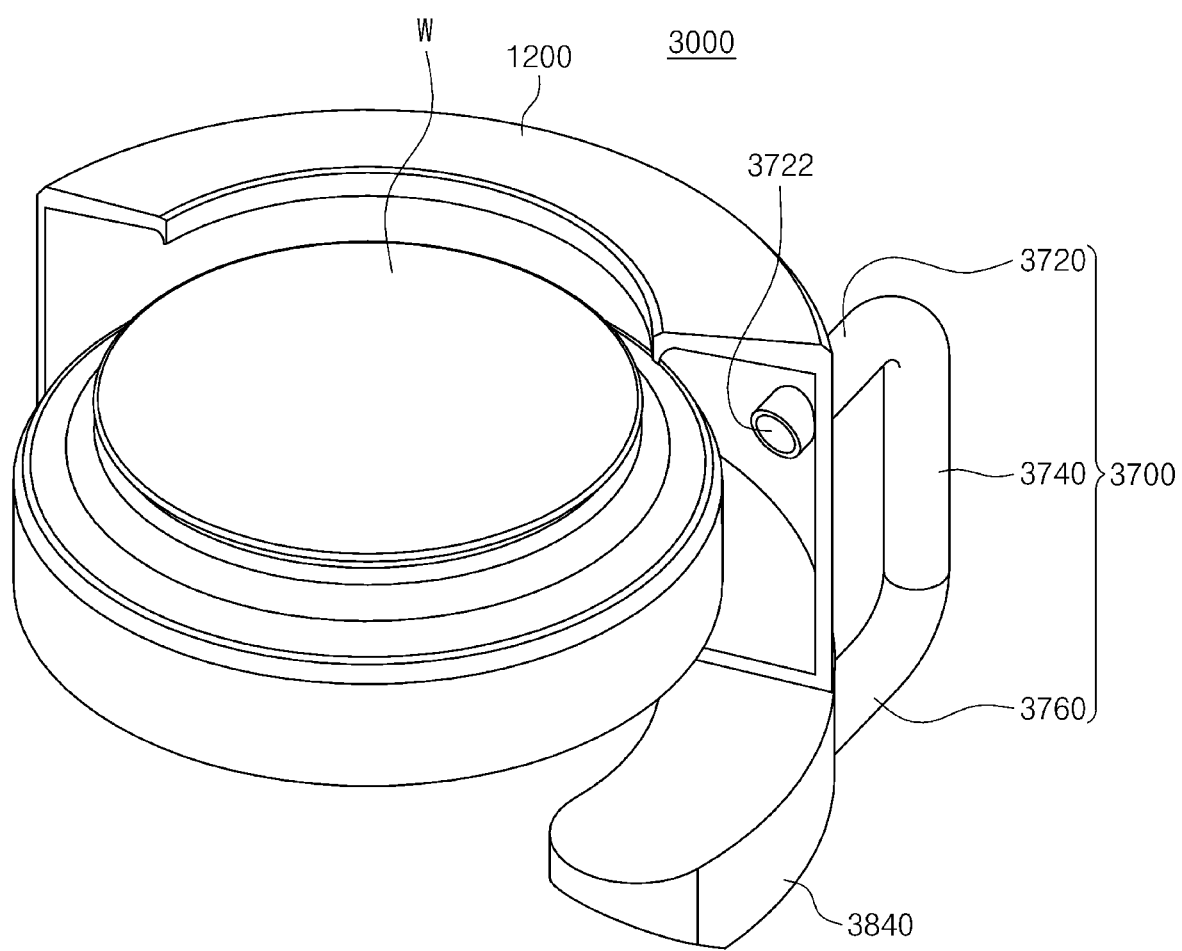
FIG. 12 is a perspective view of a partially cut part of the substrate treating apparatus.

FIG. 10 is a sectional view illustrating one embodiment of the substrate treating apparatus for treating a substrate by supplying a treating liquid onto the rotating substrate, and FIG. 11 is a perspective view illustrating the exterior of the substrate treating apparatus of FIG. 10, and FIG. 12 is a cross-sectional view of the substrate treating apparatus of FIG. 10.

Referring to FIG. 10 to FIG. 12, the substrate treating apparatus includes a housing 1100, a processing container 1200, a substrate support unit 1400, a liquid supply unit 1600, and an exhaust unit 3900.

The housing 1100 may be provided in a rectangular container shape having an inner space 1120. An opening 1102 may be formed in a sidewall of the housing 1100. The opening 1102 may function as an entrance/exit opening through which the substrate W enters and exits the housing 1100. A door (not shown) may be provided on the sidewall of the housing 1100 and opens and closes the opening 1102.

The processing container 1200 may be disposed in the inner space 1120 of the housing. The processing container 1200 has an inner space 1280. The inner space 1280 is open at the top.

The substrate support unit 1400 supports the substrate W in the inner space 1280 of the processing container 1200. The substrate support unit 1400 has a support plate 1420, a rotary shaft 1440, and an actuator 1460. The support plate 1420 has a circular top surface. The support plate 1420 has a smaller diameter than the substrate W. The support plate 1420 supports the substrate W by vacuum pressure. Selectively, the support plate 1420 may have a mechanical clamping structure that supports the substrate W. The rotary shaft 1440 is coupled to the center of the bottom surface of the support plate 1420, and the actuator 1460 providing torque to the rotary shaft 1440 is coupled to the rotary shaft 1440. The actuator 1460 may be a motor.

The liquid supply unit 1600 may supply a treating liquid 82 onto the substrate W. The treating liquid 82 supplied to the substrate W by the liquid supply unit 1600 may be a coating solution such as photoresist. The liquid supply unit 1600 has a nozzle 1620, a nozzle moving member 1640, and a liquid supply source (not shown). The nozzle 1620 may include one or more nozzles. The nozzle 1620 supplies the treating liquid 82 onto the substrate W. The nozzle 1620 is supported on the nozzle moving member 1640. The nozzle moving member 1640 moves the nozzle 1620 between a process position and a standby position. In the process position, the nozzle 1620 supplies the treating liquid 82 onto the substrate W placed on the support plate 1420. After completely supplying the treating liquid 82, the nozzle 1620 stands by in the standby position. In the standby position, the nozzle 1620 stands by in a home port (not shown). The home port is located outward of the processing container 1200 in the housing 1100.

A fan filter unit 1260 is disposed inside a top wall of the housing 1100 and supplies a downward air flow 84 into the inner space 1120. The fan filter unit 1260 has a fan that introduces outside air into the inner space 1120 and a filter that filters the outside air.

An exhaust pipe 1140 is connected to the housing 1100 so as to be located outward of the processing container 1200 and exhausts, to the outside, the air flow 84 supplied into the space between the processing container 1200 and the housing 1100.

The processing container 1200 has an outer cup 1220 and an inner cup 1240.

The outer cup 1220 surrounds the substrate support unit 1400 and the substrate W supported on the substrate support unit 1400. The outer cup 1220 has a bottom wall 1222, a sidewall 1224, and a top wall 1226. The inside of the outer cup 1220 is provided as the inner space 1280 described above. The inner space 1280 includes the treating space in an upper space and an exhaust space 1248 in a lower position than the treating space.

The bottom wall 1222 has a circular shape and has an opening in the center thereof. The sidewall 1224 extends upward from the outside end of the bottom wall 1222. The sidewall 1224 has a ring shape and is perpendicular to the bottom wall 1222. According to an embodiment, the sidewall 1224 extends to a height equal to or slightly lower than the height of the top surface of the support plate 1420. The top wall 1226 has a ring shape and has an opening in the center thereof. The top wall 1226 obliquely extends upward from the top end of the sidewall 1224 toward the central axis of the outer cup 1220.

The inner cup 1240 is located inside the outer cup 1220. The inner cup 1240 has an inner wall 1242, an outer wall 1244, and a top wall 1246. The inner wall 1242 has a through-hole formed through the inner wall 1242 in the up/down direction. The inner wall 1242 surrounds the actuator 1460. The inner wall 1242 minimizes exposure of the actuator 1460 to the air flow 84 in the treating space. The rotary shaft 1440 and/or the actuator 1460 of the substrate support unit 1400 extend in the up/down direction through the through-hole. The lower end of the inner wall 1242 may be located at a position corresponding to a position of the bottom wall 1222 of the outer cup 1220. The outer wall 1244 is spaced apart from the inner wall 1242 and surrounds the inner wall 1242. The outer wall 1244 is located to be spaced apart from the sidewall 1224 of the outer cup 1220. The inner wall 1242 is disposed to be spaced apart upward from the bottom wall 1222 of the outer cup 1220. The top wall 1246 connects the top end of the outer wall 1244 and the top end of the inner wall 1242. The top wall 1246 has a ring shape and is disposed to surround the support plate 1420. According to an embodiment, the top wall 1246 has an upwardly convex shape. The top wall 1246 has an outer top wall 1246*a* obliquely extending upward from the top end of the outer wall 1244 toward the rotary shaft 1440, and an inner top wall 1246*b* obliquely extending downward from the outer top wall 1246*a* to the top end of the inner wall 1242. The support plate 1420 may be located in the space surrounded by the inner top wall 1246*b*. According to an embodiment, the highest point of the top wall 1226 may be located outward of the support plate 1420 and may be located inward of the edge of the substrate W supported on the substrate support unit 1400.

A portion of the treating space under the support plate 1420 may be provided as the exhaust space 1248. According to an embodiment, the exhaust space 1248 may be defined by the inner cup 1240. The space surrounded by the outer wall 1244, the top wall 1246, and the inner wall 1242 of the inner cup 1240 and/or the space thereunder may be provided as the exhaust space 1248.

A gas-liquid separator 1230 may be provided in the inner space 1280 of the processing container 1200. The gas-liquid separator 1230 may extend upward from the bottom wall 1222 of the outer cup 1220. The gas-liquid separator 1230 may have a ring shape. The gas-liquid separator 1230, when viewed from above, may be located between the sidewall 1244 of the outer cup 1220 and the outer wall 1244 of the inner cup 1240. Optionally, the gas-liquid separator 1230, when viewed from the top, may be located to overlap with the outer wall 1244 of the inner cup 1240, or may be located inward of the outer wall 1244 of the inner cup 1240. According an embodiment, the top end of the gas-liquid separator 1230 may be located in a lower position than the lower end of the outer wall 1244 of the inner cup 1240.

A drain pipe 1250 for draining the treating liquid 82 is connected to the bottom wall 1222 of the outer cup 1220. The drain pipe 1250 drains the treating liquid 82 introduced between the sidewall 1224 of the outer cup 1220 and the outer wall 1244 of the inner cup 1240 to outside the processing container. According to an embodiment, a space between the sidewall 1224 of the outer cup 1220 and the gas-liquid separator 1230 is provided as a drain space 1252 for draining the treating liquid 82, and the drain pipe 1250 drains the treating liquid 82 from the drain space 1252. The air flow 84 flowing into the space between the sidewall 1224 of the outer cup 1220 and the outer wall 1244 of the inner cup 1240 is introduced into the space surrounded by the sidewall 1224 and the bottom wall 1222 of the outer cup 1220, and the gas-liquid separator 1230 and is introduced into the exhaust space 1248. In this process, the treating liquid 82 contained in the air flow 84 is drained outside the processing container 1200 from the drain space 1252 through the drain pipe 1250, and the air flow 84 is introduced into the exhaust space 1248 of the processing container 1200.

One or more drain pipes 1250 may be provided. When a plurality of drain pipes 1250 are provided, the drain pipes 1250 may be arranged along the circumferential direction of the inner cup 1240.

Although not shown, a lifting/lowering actuator for adjusting the height of the outer cup 1220 relative to the support plate 1420 may be provided. According to an embodiment, the lifting/lowering actuator may move the outer cup 1220 upward and downward. For example, the support plate 1420 is located in a higher position than the top end of the outer cup 1220 to prevent interference between a transfer member for transferring the substrate W and the outer cup 1220 when the substrate W is loaded onto or unloaded from the support plate 1420. Furthermore, when a process is performed, the support plate 1420 is located in a lower position than the top end of the outer cup 1110 such that the substrate W is located in the treating space.

The exhaust unit 1900 has a separate exhaust pipe 3820, an air flow guide duct 3700, and an integrated exhaust pipe 3840. Hereinafter, an exhaust unit 3900 according to the inventive concept will be described in more detail.

FIG. 10 to FIG. 12 are views illustrating the substrate treating apparatus 3000 including an air flow guide duct 3700 according to the inventive concept.

Referring to FIG. 10 to FIG. 12, the exhaust unit 3900 exhausts an air flow 84 in a treating space. The exhaust unit 3900 has a separate exhaust pipe 3820, an air flow guide duct 3700 and an integrated exhaust pipe 3840.

The separate exhaust pipe 3820 is connected with an exhaust space 1248 in the substrate treating apparatus 3000. One or more separate exhaust pipes 3820 may be provided. According to an embodiment, the separate exhaust pipe 3820 is connected to a bottom wall 1222 of an outer cup 1220, and an inlet of the separate exhaust pipe 3820 is located to be spaced apart upward from the bottom wall 1222 of the outer cup 1220 by a predetermined height.

The air flow guide duct 3700 guides the air flow 84 at a height equal to the height of a top surface of a substrate W supported on a substrate support unit 1400 or at a height adjacent to the top surface of the substrate W. When the substrate W rotates, the downward air flow 84 supplied to an upper region of the substrate W flows from a central region of the substrate W toward an edge region of the substrate W by the centrifugal force. Furthermore, on the surface of the substrate W and in a region adjacent thereto, the air flow 84 flows toward the outside of the substrate W while curving in the same direction as the rotating direction of the substrate W. When the air flow 84 deviates from the top surface of the substrate W, the direction of the air flow 84 is tangential to the rotating direction of the substrate W.

The air flow guide duct 3700 is provided such that the air flow 84 deviating from the top surface of the substrate W is introduced into the air flow guide duct 3700 in a tangential direction with respect to the rotating direction of the substrate W.

The airflow guide duct 3700 is disposed at an outer side of the processing container 1200. The airflow guide duct 3700 has an airflow introduction part 3720, a connection part 3740, and an airflow discharge part 3760. The airflow introduction part 3720 has an inlet 3722 through which the airflow 84 is introduced from the treating space. The inlet 3722 is provided at a substantially same level with the substrate W supported by the support unit 1400. The inlet 3722 is provided to introduce the airflow 84 in a direction parallel to the tangential direction of the substrate W supported by the support unit 1400. The airflow discharge part 3760 may have an exit 3762, and the airflow discharge part 3760 may be connected to an integrated exhaust pipe 3840 to be described later. The connection part 3740 connects the airflow introduction part 3720 and the airflow discharge part 3760.

The air flow guide duct 3700 has a tubular shape. A direction of a length of the air flow introduction part 3720 of the air flow guide duct 3700 may be parallel with the tangential direction of the substrate W. In addition, the airflow discharge part 3760 of the airflow guide duct 3700 may be disposed below the airflow introduction part 3720 and may be provided parallel to the airflow introduction part 3720 to face the airflow introduction part 3720. A direction of a length of the connection part 3740 may be provided perpendicular to the air flow introduction part 3720 and the airflow discharge part 3760.

One or a plurality of air flow guide ducts 3700 can be provided. According to an embodiment, two air flow guide ducts 3700 can be provided and they may be provided at regular intervals based on the center of the rotation of the substrate W. Alternatively, three or more air flow guide ducks 3700 may be provided.

The integrated air flow pipe 3840 is placed at an outer side of the outer cup 1220. According to an embodiment, the integrated air flow pipe 3840 may be placed outside the housing 1100. The integrated air flow pipe 3840 has an air flow introduction portion 3842 and an air flow discharge portion 3844.

According to an embodiment, the air flow introduction portion 3842 has a ring shape. The separate exhaust pipe 3820 and the air flow guide duct 3700 are coupled to the air flow introduction portion 3842, and gas flowing out of the separate exhaust pipe 3820 and the air flow guide duct 3700 is introduced into the air flow introduction portion 3842 of the integrated exhaust pipe 3840. The air flow discharge portion 3844 is located in a space surrounded by the air flow introduction portion 3842, and a connecting part connects the air flow introduction portion 3842 and the air flow discharge part 3844, so that the air flow introduced to the air flow introduction part 3842 flows to the air flow discharge portion 3844. The separate exhaust pipe 3820 is connected to the air flow introduction portion 3842 at a position closer to the air flow discharge portion 3844 than to the air flow guide duct 3700. A gas-liquid separator 3846 may be provided between the point where the separate exhaust pipe 3820 is connected to the air flow introduction portion 3842 and the air flow discharge portion 3844. According to an embodiment, the gas-liquid separator 3846 may be provided in the air flow introduction portion 3842. The gas-liquid separator 3846 has an arc shape and protrudes upward from the bottom surface of the air flow introduction portion 3842. Furthermore, the gas-liquid separator 3846 is spaced apart from the top surface of the air flow introduction portion 3842.

Also, a drain pipe 3848 is provided on the opposite side of the air flow discharge portion 3844 with respect to the point where the gas-liquid separator 3846 is installed in the air flow introduction portion 3842. The drain pipe 3848 drains, to an outside the integrated exhaust pipe 3840, a liquid separated from the air flow 84 introduced into the air flow introduction portion 3842. According to an embodiment, the drain pipe 3848 is provided at a position adjacent to the gas-liquid separator 3846.

Figure 13:
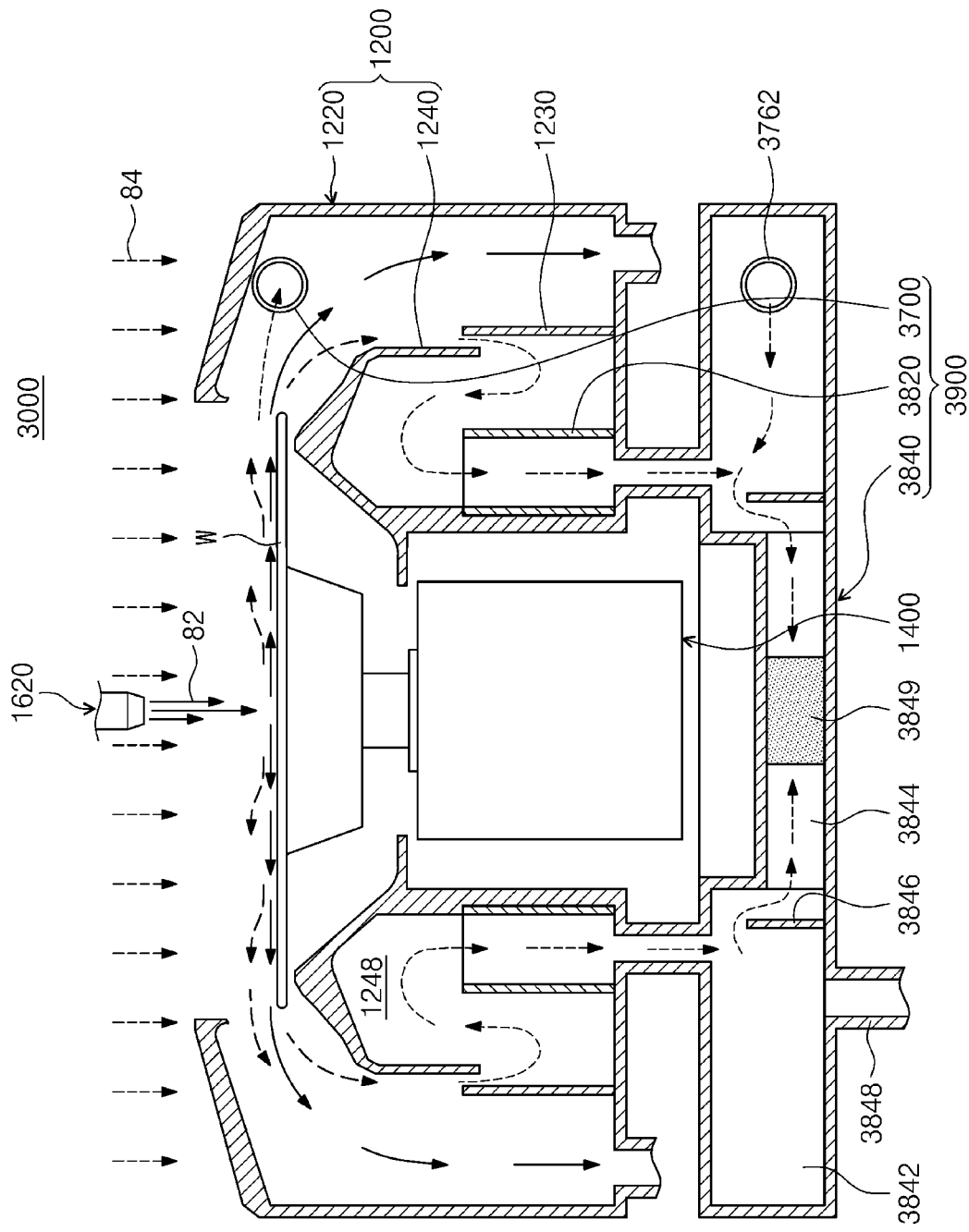
FIG. 13 and FIG. 14 are a sectional view and a sectional perspective view illustrating flow paths of an air flow and a treating liquid when a substrate is subjected to liquid treatment through the apparatus of FIG. 10.
Figure 14:
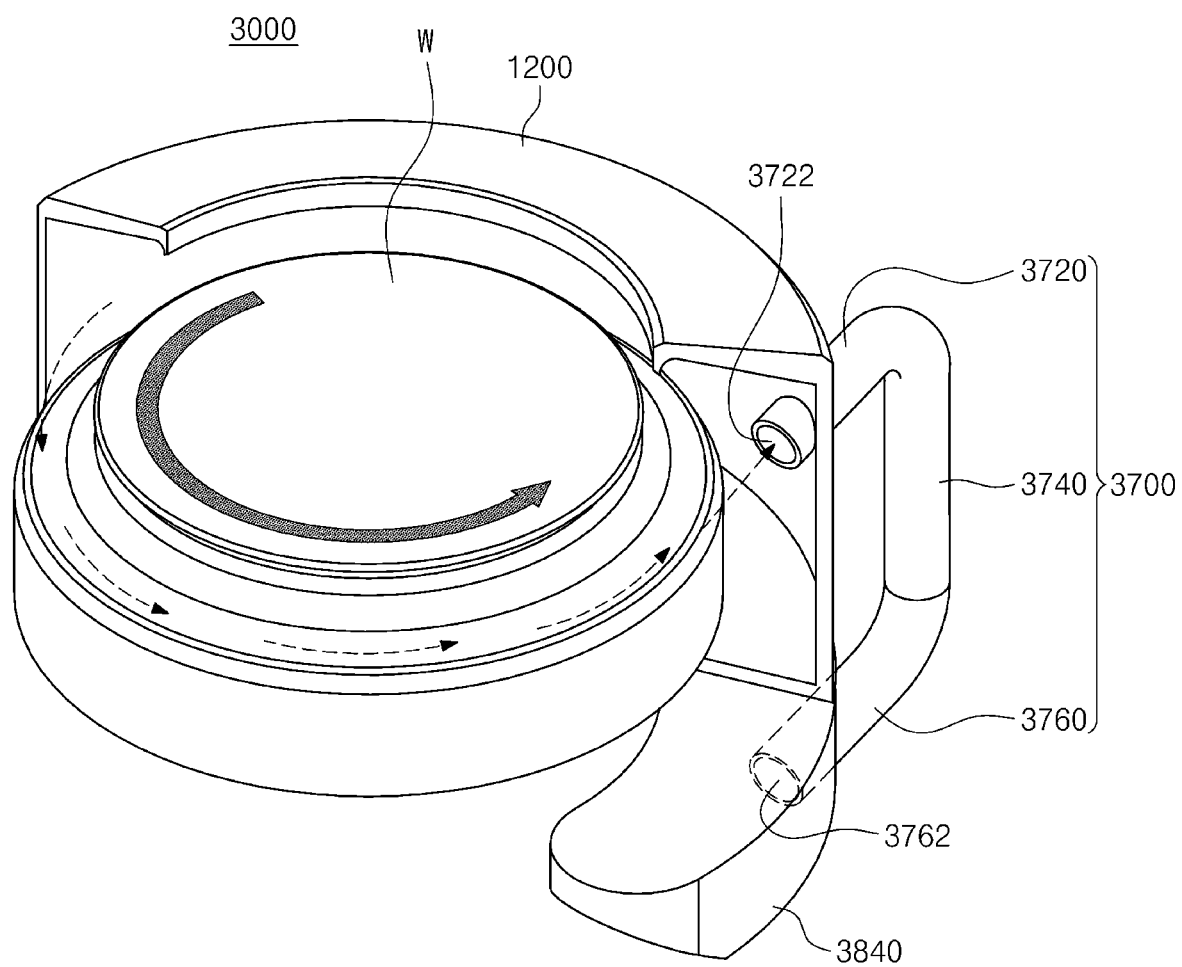

FIGS. 13 and 14 are a sectional view and a sectional perspective view illustrating flow paths of the air flow 84 and the treating liquid 82 when the substrate W is subjected to liquid treatment through the apparatus of FIG. 10.

Referring to FIGS. 13 and 14, in a coating process, the substrate W is supported on the support plate 1420 and is rotated by the support plate 1420. At this time, the substrate support unit 1400 rotates the substrate W such that the air flow 84 generated by the rotation of the substrate W flows toward the inlet 3722 of the air flow guide duct 3700. Outside air is supplied as the downward air flow 84 from the fan filter unit 1260 toward the substrate W. Furthermore, the treating liquid 82 is supplied onto the substrate W from the nozzle 1620. Due to the rotation of the substrate W, the air flow 84 on the top surface of the substrate W flows toward the outside of the substrate W while curving in the rotating direction of the substrate W. When the air flow 84 flows toward the outside of the substrate W, part of the air flow 84 is introduced into the air flow guide duct 3700 and thereafter exhausted outside the processing container 1200. Furthermore, the rest of the air flow 84 flows downward through the gap between the inner cup 1240 and the outer cup 1220.

Thereafter, the rest of the air flow 84 is introduced into the exhaust space 1248 in the processing container 1200 and exhausted outside the processing container 1200 through the separate exhaust pipe 3820. In addition, the treating liquid 82 used to treat the substrate W is introduced into the drain space 1252 through the space between the inner cup 1240 and the outer cup 1220 and thereafter drained outside the processing container 1200 through the drain pipe 1250.

The air flow 84 exhausted from the air flow guide duct 3700 and the separate exhaust pipe 3820 is introduced into the air flow introduction portion 3842 of the integrated exhaust pipe 3840. Thereafter, the treating liquid 82 is separated by the gas-liquid separator 3846, and the air flow 84 is exhausted to the outside through the air flow discharge portion 3844.

According to the embodiment of FIG. 10, part of the air flow 84 is introduced into the air flow guide duct 3700. At this time, the air flow 84 flowing toward the outside of the substrate W by the centrifugal force may be smoothly introduced into the air flow guide duct 3700 without collision or interference the processing container 1200 or components thereof because the air flow guide duct 3700 is provided such that the air flow 84 is introduced into the air flow guide duct 3700 in the tangential direction to the rotating direction of the substrate W.

Furthermore, part of the air flow 84 is introduced into the exhaust space 1248 in the processing container 1200. However, the amount of air flow 84 introduced into the exhaust space 1248 is very small, as compared with when the air flow guide duct 3700 is not provided. Thus, the air flow 84 may be smoothly exhausted through the exhaust space 1248 without a vortex or a big collision.

Hereinafter, a substrate treating apparatus 4000 according to a second embodiment of the inventive concept will be described in more detail with reference to figures.

Figure 15:
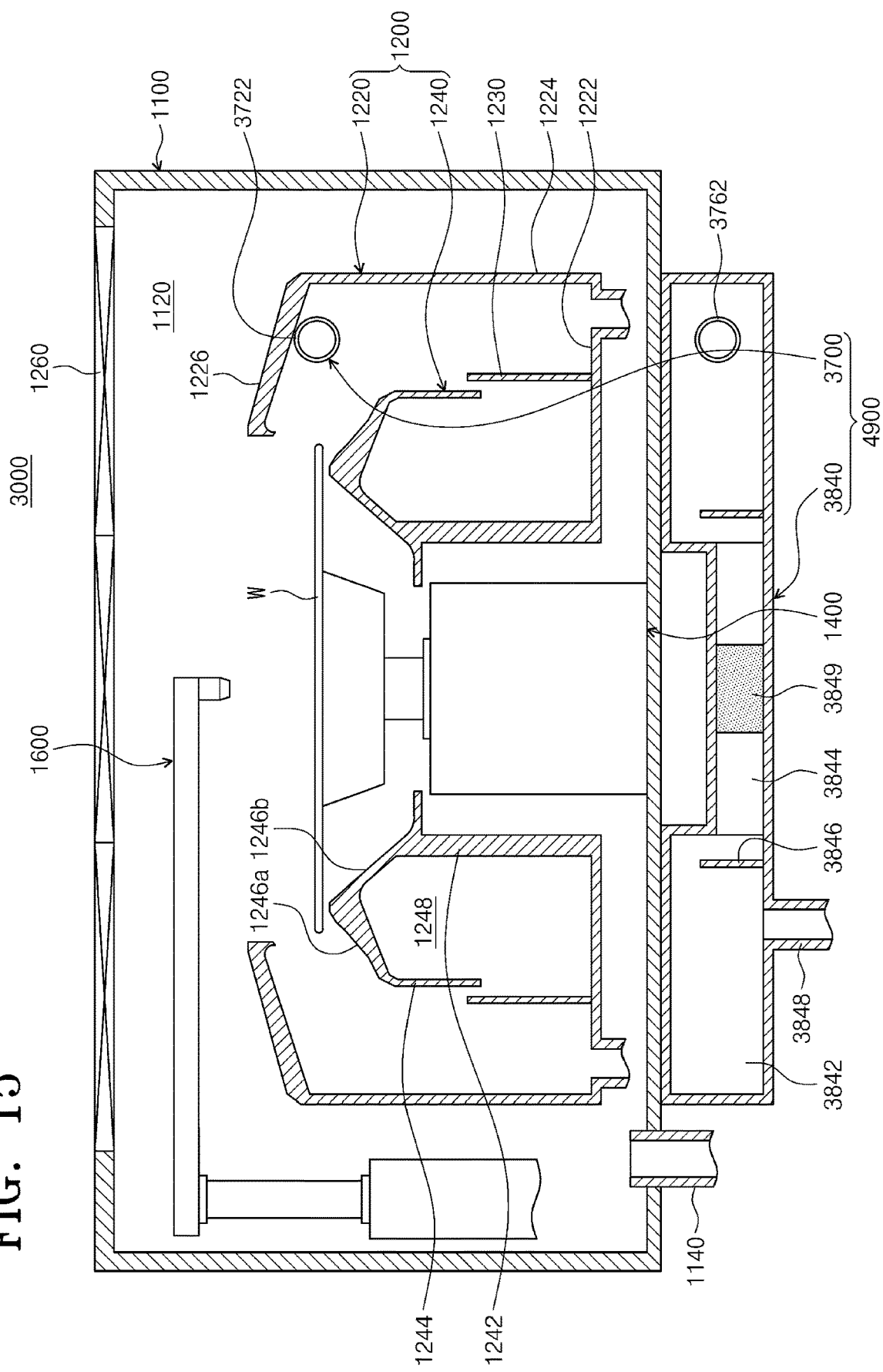
FIG. 15 is a schematic sectional view illustrating a structure of a substrate treating apparatus for treating a substrate by supplying a liquid onto the rotating substrate according to a second embodiment of the inventive concept.
Figure 16:
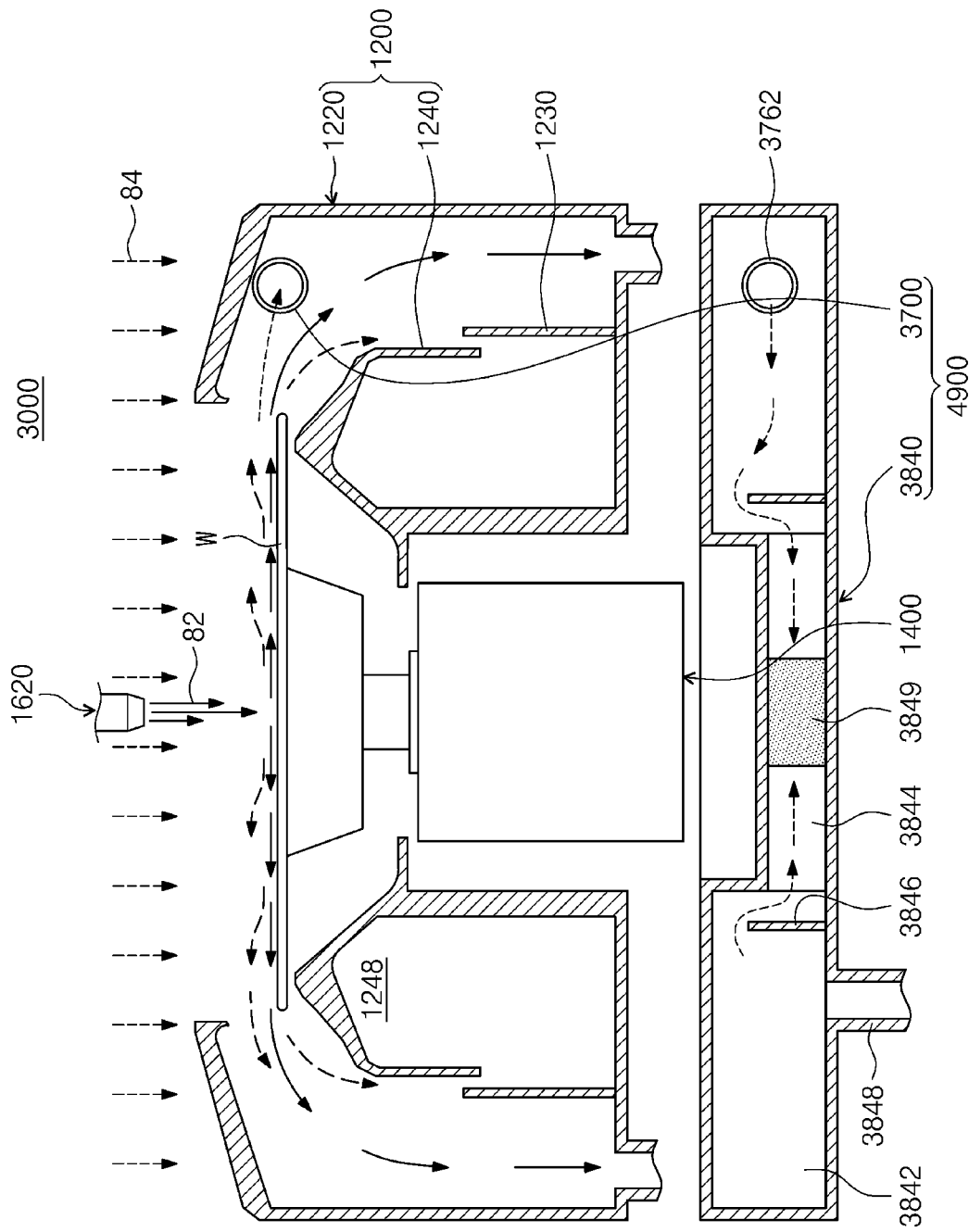
FIG. 16 is a sectional perspective view illustrating a flow path of an air flow and a treating liquid when a substrate is subjected to liquid treatment through the apparatus of FIG. 15.

FIG. 15 is a cross-sectional view schematically illustrating a structure of a substrate treating apparatus for processing a substrate by supplying a liquid to a rotating substrate according to a second embodiment of the inventive concept, and FIG. 16 is a cross-sectional view showing a flow path of an air flow and a treating liquid during a liquid treatment using the apparatus of FIG. 15. In the first embodiment, it has been described that the air flow 84 supplied to the substrate W flows into the first path introducing the air flow into the exhaust space 1248 positioned below the support plate 1420 in the treating container 1200, and the second path introducing the air flow into the air flow guide duct 3700. However, in the second embodiment, all of the airflow 84 supplied to the substrate W is provided to flow only through the second path.

Specifically, the substrate treating apparatus 4000 according to the second embodiment differs from the substrate treating apparatus 3000 according to the first embodiment at the exhaust unit 3700 thereof, and all other configurations are the same. Specifically, in the substrate treating apparatus 4000 according to the second embodiment, the individual exhaust pipes 3820 are deleted from the exhaust unit 3700 of the substrate treating apparatus 3000 according to the first embodiment, and are configured only with an air flow guide duct 3700 and an integrated exhaust pipe 3940 to exhaust airflow 84 in the treating space. Hereinafter, the same reference numerals are assigned to the same configuration as the substrate treating apparatus 3000 according to the first embodiment, and a description thereof will be omitted.

Referring to FIG. 15, the substrate treating apparatus 4000 according to the second embodiment includes an exhaust unit 4900. The exhaust unit 4900 exhausts the airflow 84 in the treating space. The exhaust unit 4900 includes an air flow guide duct 3700 and an integrated exhaust pipe 3840.

The air flow guide duct 3700 guides the air flow 84 at a height equal to the height of a top surface of a substrate W supported on a substrate support unit 1400 or at a height adjacent to the top surface of the substrate W. When the substrate W rotates, the downward air flow 84 supplied to an upper region of the substrate W flows from a central region of the substrate W toward an edge region of the substrate W by the centrifugal force. Furthermore, on the surface of the substrate W and in a region adjacent thereto, the air flow 84 flows toward the outside of the substrate W while curving in the same direction as the rotating direction of the substrate W. When the air flow 84 deviates from the top surface of the substrate W, the direction of the air flow 84 is tangential to the rotating direction of the substrate W.

The air flow guide duct 3700 is provided such that the air flow 84 deviating from the top surface of the substrate W is introduced into the air flow guide duct 3700 in a tangential direction to the rotating direction of the substrate W.

The air flow guide duct 3700 is disposed at an outer side of the processing container 1200. The air flow guide duct 3700 has an air flow introduction part 3720, a connecting part 3740, and an air flow discharge part 3760. The air flow introduction part 3720 has an inlet 3722 through which the air flow 84 flows into the air flow introduction part 3720 from the treating space. The inlet 3722 is provided at the same height as the substrate W supported on the substrate support unit 1400 or at a height adjacent to the substrate W. The inlet 3722 is provided such that the air flow 84 is introduced in a direction parallel to a tangential direction of the substrate W supported on the substrate support unit 1400. The air flow discharge part 3760 has an outlet 3762, and may be connected with the integrated exhaust pipe 3840 to be described below. The connecting part 3740 connects the air flow introduction part 3720 and the air flow discharge part 3760.

The air flow guide duct 3700 has a tubular shape. The air flow introduction part 3720 of the air flow guide duct 3700 is provided such that a direction of a length thereof is parallel to the tangential direction of the substrate W. Furthermore, the air flow discharge part 3760 of the air flow guide duct 3700 may be disposed under the air flow introduction part 3720 and may be parallel to the air flow introduction part 3720 to face the air flow introduction part 3720. The connecting part 3740 may be provided such that a direction of a length thereof is perpendicular to the air flow introduction part 3720 and the air flow discharge part 3760.

One or a plurality of air flow guide ducts 3700 may be provided. According to an embodiment, two air flow guide ducts 3700 may be provided. The two air flow guide ducts 3700 may be spaced apart from each other at regular intervals with respect to the center of rotation of the substrate W. Alternatively, three or more air flow guide ducts 3700 may be provided.

The integrated exhaust pipe 3840 is disposed outside the outer cup 1220. According to an embodiment, the integrated exhaust pipe 3840 may be disposed outside a housing 1100. The integrated exhaust pipe 3840 has an air flow introduction portion 3842 and an air flow discharge portion 3844.

According to an embodiment, the air flow introduction part 3842 has a ring shape. The air flow introduction portion 3842 is coupled to the air flow guide duct 3700, and gas discharged from the air flow guide duct 3700 is introduced into the air flow introduction portion 3842 of the integrated exhaust pipe 3840. The air flow discharge part 3844 is located in a space surrounded by the air flow introduction portion 3842, and the connecting part connects the air flow introduction part 3842 and the air flow discharge portion 3844 to allow the gas introduced into the air flow introduction portion 3842 to flow toward the air flow discharge portion 3844. The gas-liquid separator 3846 may be provided in the air flow introduction portion 3842. The gas-liquid separator 3846 has an arc shape and protrudes upward from the bottom surface of the air flow introduction portion 3842. Furthermore, the gas-liquid separator 3846 is spaced apart from the top surface of the air flow introduction portion 3842. The space between the gas-liquid separator 3846 and the air flow introduction portion 3842 serves as a path through which the air flow 84 introduced into the air flow introduction portion 3842 flows to the air flow discharge portion 3844.

A drain pipe 3250 is provided facing the air flow discharge portion 3844 with respect to the point where the gas-liquid separator 3840 is installed in the air flow introduction portion 3842. The drain pipe 3250 drains, outside the integrated exhaust pipe 3840, a liquid separated from the air flow 84 introduced into the air flow introduction portion 3842. According to an embodiment, the drain pipe 3250 is provided at a position adjacent to the gas-liquid separator 1230.

Referring to FIG. 16, in a coating process, the substrate W is supported on the support plate 1420 and is rotated by the support plate 1420. At this time, the substrate support unit 1400 rotates the substrate W such that the air flow 84 generated by the rotation of the substrate W flows toward the inlet 3722 of the air flow guide duct 3700. Outside air is supplied as the downward air flow 84 from the fan filter unit 1260 toward the substrate W. Furthermore, the treating liquid 82 is supplied onto the substrate W from the nozzle 1620. Due to the rotation of the substrate W, the air flow 84 on the top surface of the substrate W flows toward the outside of the substrate W while turning in the rotating direction of the substrate W. When the air flow 84 flows toward the outside of the substrate W, most of the air flow 84 is introduced into the air flow guide duct 3700 and thereafter exhausted outside the processing container 1200. Also, the treating liquid 82 having processed the substrate is introduced into a space between the inner cup 1240 and the outer cup 1220, and discharged to the outside of the treating container through the discharge pipe 1250.

The air flow 84 exhausted from the air flow guide duct 3700 is introduced into the air flow introduction portion 3842 of the integrated exhaust pipe 3840. Thereafter, the treating liquid 82 is separated by the gas-liquid separator 3846, and the air flow 84 is exhausted to the outside through the air flow discharge portion 3844.

According to the embodiment of FIG. 15, the air flow 84 is introduced into the air flow guide duct 3700. At this time, the air flow 84 flowing toward the outside of the substrate W by the centrifugal force may be smoothly introduced into the air flow guide duct 3700 without collision or interference with the processing container 1200 or components thereof because the air flow guide duct 3700 is provided such that the air flow 84 is introduced into the air flow guide duct 3700 in the tangential direction to the rotating direction of the substrate W.

Furthermore, part of the air flow 84 is introduced into the exhaust space 1248 in the processing container 1200. However, the amount of air flow 84 introduced into the exhaust space 1248 is very small, as compared with when the air flow guide duct 3700 is not provided. Accordingly, the air flow 84 introduced into the exhaust space 1248 collides or interferes with an external member in a small amount, and thus may be smoothly exhausted without a vortex or a big collision.

Figure 17A:
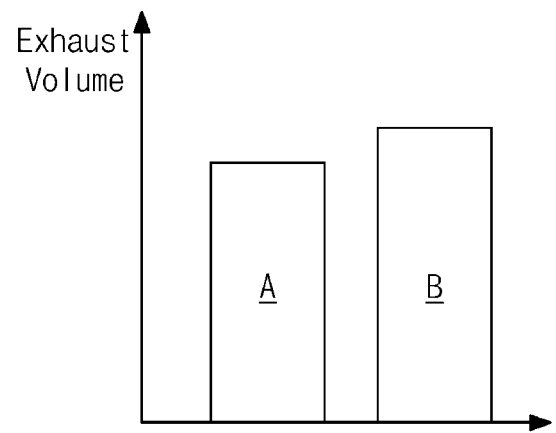
FIG. 17A and FIG. 17B are graphs depicting exhaust flow rates of the substrate treating apparatus having the conventional structure illustrated in FIG. 1 and a substrate treating apparatus equipped with an air flow guide duct as in the embodiments of the inventive concept.
Figure 17B:
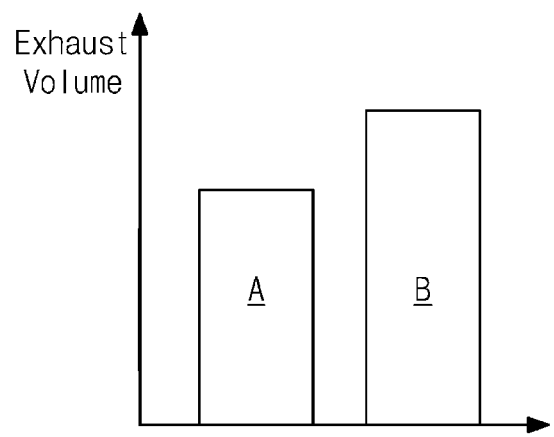
Figure 18:
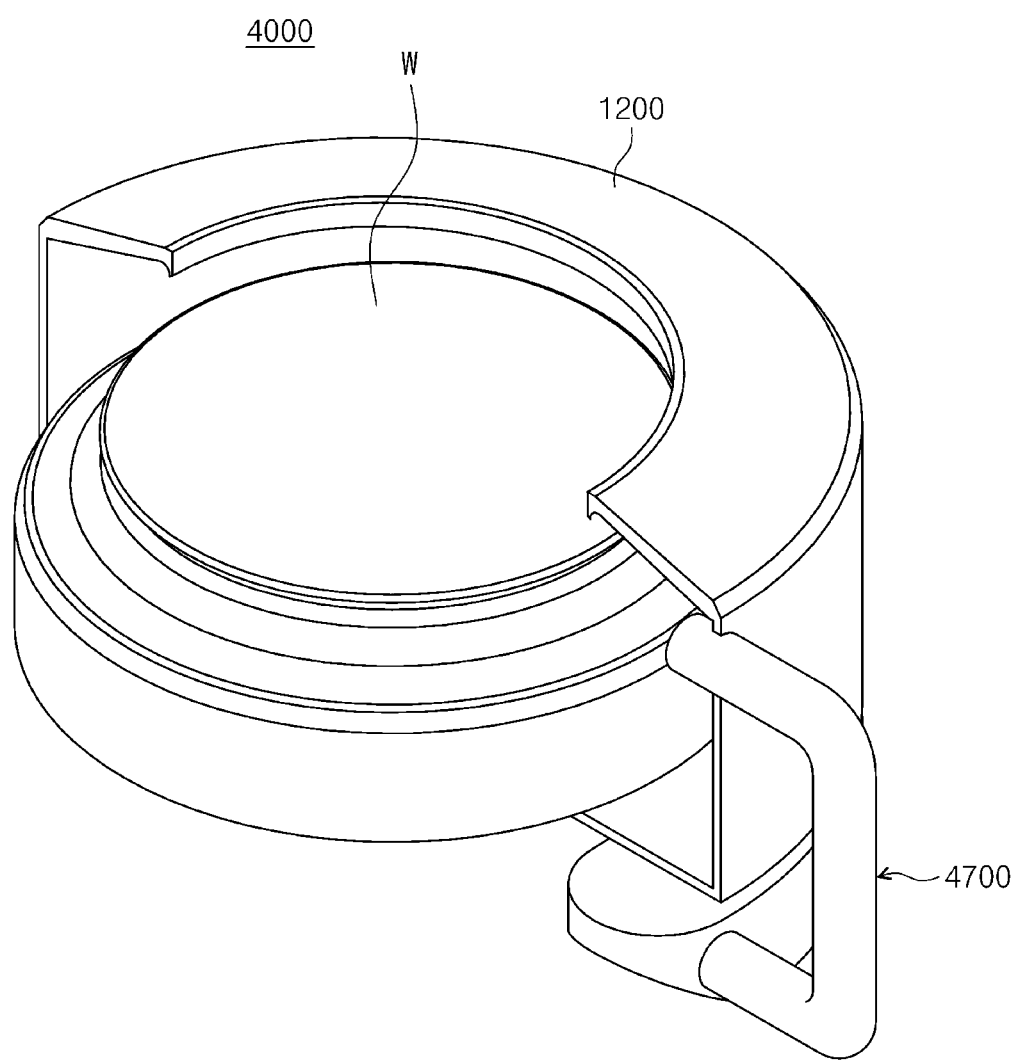
FIG. 18 is a perspective view of a substrate treating apparatus according to another embodiment of the inventive concept.

FIG. 17*a* and FIG. 17*b* are graphs depicting exhaust flow rates of the substrate treating apparatus having the conventional structure illustrated in FIG. 1 and a substrate treating apparatus equipped with an air flow guide duct as in an embodiment of the inventive concept. FIG. 17*a* is a graph depicting and comparing an exhaust flow rate of a conventional substrate treating apparatus and the substrate treating apparatus of the inventive concept when a substrate W is rotated at a low speed, and FIG. 17*b* is a graph depicting an exhaust flow rate of the conventional substrate treating apparatus and the substrate treating apparatus of the inventive concept when the substrate W is rotated at a high speed.

In FIG. 17*a* and FIG. 17*b*, the substrate treating apparatus of the inventive concept is the substrate treating apparatus illustrated in FIG. 10. In FIG. 17*a*, the substrate W was rotated at 2500 rpm, and in FIG. 17*b*, the substrate W was rotated at 5000 rpm.

Referring to FIG. 17*a*, when the substrate W was rotated at 2500 rpm, the exhaust flow rate of the substrate treating apparatus A of FIG. 1 was 1257 lpm. However, the exhaust flow rate of the substrate treating apparatus B of the inventive concept was increased to 1418 lpm by about 12%. Referring to FIG. 17*b*, when the substrate W was rotated at 5000 rpm, the exhaust flow rate of the substrate treating apparatus A of FIG. 1 was 1114 lpm. However, the exhaust flow rate of the substrate treating apparatus B of the inventive concept was increased to 1468 lpm by about 35%.

Through FIG. 17*a* and FIG. 24*b*, it can be seen that the exhaust efficiency is increased by the air flow guide duct, which suctions the air flow 84 in the tangential direction to the rotating direction of the substrate W, not only when the process is performed while the substrate W is rotated at a low speed but also when the process is performed while the substrate W is rotated at a high speed, and as the rotating speed of the substrate W is increased, the exhaust efficiency is further increased compared to the conventional structure.

Although it has been described that the processing container includes the outer cup and the inner cup, and the exhaust space in the inner space of the processing container is defined by the inner cup, the processing container may not include the inner cup, and the exhaust space in the inner space of the processing container may be defined as the area under the support plate that supports the substrate W.

In the above-described example, the airflow guide duct introduces an airflow in a tangential direction to the rotation direction of the substrate W. However, unlike this, the airflow guide duct may be provided to introduce airflow in a direction other than a tangential direction to the rotational direction of the substrate W. For example, as illustrated in FIG. 28, the airflow guide duct may be provided such that the inlet thereof is disposed at the same or adjacent height as the substrate and sucks the airflow in the radial direction of the substrate W.

The above description exemplifies the inventive concept. Furthermore, the above-mentioned contents describe embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

What is claimed is:

1. An apparatus for treating a substrate, the apparatus comprising:
   a processing container having an inner space;
   a support unit having a support plate configured to support and rotate the substrate in the inner space;
   a liquid supply unit configured to supply treating liquid to the substrate supported by the support unit; and
   an exhaust unit configured to exhaust an air flow in the inner space,
   wherein the support unit comprises:
   a rotary shaft rotating the support plate;
   an actuator coupled to the rotary shaft and providing rotation power to the rotary shaft,
   wherein the processing container comprises:
   an outer cup providing the inner space;
   an inner cup placed in the inner space to be apart from the outer cup, and surrounding the rotary shaft,
   wherein the inner cup defines an exhaust space in an area below the support plate,
   wherein the exhaust unit includes:
   an air flow guide duct guiding a flow direction of an air flow flowing on the substrate to an outer side of the substrate due to a rotation of the substrate supported by the support unit, and the air flow guide duct having an inlet into which an air flow is introduced;
   a separate exhaust pipe for exhausting an air flow introduced into the exhaust space to an outside of the inner space; and
   an integrated exhaust pipe with an installed pressure adjustment member, the separate exhaust pipe and the air flow guide duct being connected to the integrated exhaust pipe,
   wherein the air flow guide duct is placed at an outer side of the processing container, and
   wherein one end of the air flow guide duct is connected to the outer cup, and another end is connected to the integrated exhaust pipe.

2. The apparatus of claim 1, wherein the inlet is provided at a substantially same level with the substrate supported by the support unit, and the inlet provided at the air flow guide duct introduces an air flow in a tangential direction to the rotating direction of the substrate supported by the support unit.

3. The apparatus of claim 1, wherein a plurality of air flow guide ducts are provided placed apart in a circumferential direction of the substrate supported by the support unit.

4. The apparatus of claim 3, wherein the plurality of air flow guide ducts are placed apart at regular intervals based on a center of the rotation of the substrate.

5. The apparatus of claim 1,
   wherein the inner cup is configured to surround the rotary shaft and the actuator.

6. The apparatus of claim 1, wherein the air flow guide duct comprises:
   an air flow introduction portion including the inlet for introducing an air flow in the inner space;
   an air flow discharge portion connected to the integrated exhaust pipe; and
   a connecting part connecting the air flow introduction portion and the air flow discharge portion.

7. The apparatus of claim 6, wherein a length of the air flow introduction portion is provided parallel to a tangential direction of the substrate.

8. The apparatus of claim 7, wherein a length of the connecting part is provided in a different direction to a direction of the length of the air flow introduction portion.

9. The apparatus of claim 8, wherein the air flow discharge portion is placed below and in parallel with the air flow introduction portion.

10. The apparatus of claim 6, wherein the air flow guide duct is formed extending from the inner space to an outside of the processing container, the air flow discharge portion includes an exit connected to the integrated exhaust pipe, the inlet of the air flow introduction portion is provided in the inner space, and the exit of the air flow discharge portion is provided at an outer side of the processing container.

11. The apparatus of claim 1,. further comprising a liquid supply nozzle supplying photoresist to the substrate supported by the support unit.

12. An apparatus for treating a substrate, the apparatus comprising:
    a processing container having an inner space;
    a support unit having a support plate configured to support and rotate the substrate in the inner space; and
    an exhaust unit configured to exhaust an air flow in the inner space,
    wherein the support unit comprises:
    a rotary shaft rotating the support plate;
    an actuator coupled to the rotary shaft and providing rotation power to the rotary shaft,
    wherein the processing container comprises:
    an outer cup providing the inner space;
    an inner cup placed in the inner space to be apart from the outer cup, and surrounding the rotary shaft,
    wherein the inner cup defines an exhaust space in an area below the support plate, wherein the exhaust unit comprises:
    an exhaust pipe for exhausting an air flow through a first path to the outside of the processing container, the first path defined by a space between the inner wall of the processing container and the substrate supported by the supporting plate, and an exhaust space of the inner space below the support plate and in communicate with the space; and
    an air flow guide duct for guiding the air flow to a second path different from the first path,
    wherein the exhaust pipe includes:
    a separate exhaust pipe for exhausting an air flow introduced into the exhaust space to an outside of the inner space; and
    an integrated exhaust pipe with an installed pressure adjustment member, the separate exhaust pipe and the air flow guide duct being connected to the integrated exhaust pipe,
    wherein the air flow guide duct is placed at an outer side of the processing container, and
    wherein one end of the air flow guide duct is connected to the outer cup, and another end is connected to the integrated exhaust pipe.

13. The apparatus of claim 12, wherein the second path is defined by a tangential direction to the rotation direction of the substrate supported by the support unit.

14. The apparatus of claim 12, wherein the inlet is provided at a substantially same level with the substrate supported by the support unit.

15. An apparatus for treating a substrate, the apparatus comprising:

a processing container having an inner space;
a support unit having a support plate configured to support and rotate the substrate in the inner space; and
an exhaust unit configured to exhaust an air flow in the inner space,
wherein the processing container comprises:
an outer cup providing the inner space;
an inner cup placed in the inner space to be apart from the outer cup,
wherein the inner cup defines an exhaust space in an area below the support plate, the exhaust unit includes:
an air flow guide duct guiding an air flow direction flowing to the outer side of the substrate due to a rotation of the substrate supported by the support unit, and the air flow guide duct having an inlet provided at a substantially same level with the substrate supported by the support unit;
a separate exhaust pipe for exhausting an air flow introduced into the exhaust space to an outside of the inner space; and
an integrated exhaust unit located at an outside of the processing container and provided with a pressure adjustment member,
wherein the inlet of the air flow guide unit is provided to introduce an air flow in a tangential direction to the substrate supported by the support plate, and
wherein the air flow guide duct is placed at an outer side of the processing container,
the air flow guide duct includes:
an air flow introduction portion with the inlet introducing an air flow into the inner space;
an air flow discharge portion connected to the integrated exhaust pipe; and
a connecting unit connecting the air flow introduction portion and the air flow discharge portion,
wherein the air flow introduction portion is provided with its length parallel to the tangential direction of the substrate.

16. The apparatus of claim 15, wherein a plurality of the air flow guide ducts are placed apart in regular intervals.

17. The apparatus of claim 15, wherein the air flow guide ducts are formed extending to the outside of the processing container from the inner space.

18. The apparatus of claim 15, further comprising a gas-liquid separator located between a sidewall of the outer cup and an outer wall of the inner cup.

* * * * *